United States Patent
Mitchell et al.

(10) Patent No.: US 10,432,258 B1
(45) Date of Patent: Oct. 1, 2019

(54) SYSTEMS AND METHODS FOR MONITORING AND ANALYZING BROADBAND OVER POWER LINE DATA

(71) Applicant: The Boeing Company, Chicago, IL (US)

(72) Inventors: Timothy M. Mitchell, Seattle, WA (US); Everett D. Brown, Arlington, WA (US); Payal Shah, Bellevue, WA (US); Shahram Nameni, Redmond, WA (US); Donald E. Dillenburg, Issaquah, WA (US); Navpreet Singh, Lynnwood, WA (US); Michael D. McInnis, Port Orchard, WA (US)

(73) Assignee: THE BOEING COMPANY, Chicago, IL (US)

(*) Notice: Subject to any disclaimer, the term of this patent is extended or adjusted under 35 U.S.C. 154(b) by 0 days.

(21) Appl. No.: 16/147,015

(22) Filed: Sep. 28, 2018

(51) Int. Cl.
| | | |
|---|---|---|
| *H04B 3/56* | (2006.01) | |
| *H04B 3/54* | (2006.01) | |
| *H04L 29/08* | (2006.01) | |
| *G01R 19/25* | (2006.01) | |
| *B60L 11/18* | (2006.01) | |
| *G01M 11/00* | (2006.01) | |

(52) U.S. Cl.
CPC .......... *H04B 3/546* (2013.01); *B60L 11/1816* (2013.01); *B60L 11/1824* (2013.01); *G01M 11/3109* (2013.01); *G01R 19/2513* (2013.01); *H04B 3/56* (2013.01); *H04L 67/12* (2013.01); *H04B 2203/5454* (2013.01)

(58) Field of Classification Search
CPC .. H04B 3/54; H04B 3/56; H04L 67/12; H04L 67/542; B60L 11/1816; B60L 11/1824; G01M 11/3109; G01R 19/2513
USPC ........... 340/537, 538, 12.31, 13.31; 370/338, 370/445; 375/257
See application file for complete search history.

(56) References Cited

U.S. PATENT DOCUMENTS

| | | | |
|---|---|---|---|
| 7,893,557 B2 * | 2/2011 | Davis ..................... | H04B 3/548 307/3 |
| 9,295,032 B2 | 3/2016 | Kumar et al. | |
| 9,306,625 B2 | 4/2016 | Lee | |
| 9,876,533 B2 | 1/2018 | Lee et al. | |
| 10,003,382 B1 * | 6/2018 | Shi .......................... | H04B 3/54 |

(Continued)

*Primary Examiner* — Hung T Nguyen
(74) *Attorney, Agent, or Firm* — MH2 Technology Law Group LLP

(57) ABSTRACT

A system includes a multi-use power interface configured to be electrically and communicatively coupled to a vehicle via Broadband over Power Line (BPL) data links. The system also includes sensors configured to collect power quality data and load management data for the BPL data links and the multi-use power interface. The multi-use power interface includes a user interface, a processor, and a memory having instructions stored thereon that, when executed by the processor, cause the multi-use power interface to perform operations. The operations include receiving power quality data and load management data from the sensors. The operations also include determining, based on the received data, functional health statuses of the multi-use power interface and the BPL data links. The operations further include transmitting the functional health statuses, the power quality data, and the load management data to a data store, and indicating, in the user interface, the functional health statuses.

21 Claims, 9 Drawing Sheets

(56) References Cited

U.S. PATENT DOCUMENTS

| | | | |
|---|---|---|---|
| 10,086,782 B1* | 10/2018 | Konrardy | G05D 1/0088 |
| 2014/0313629 A1* | 10/2014 | Lee | H04B 3/56 |
| | | | 361/104 |

* cited by examiner

SYSTEMS AND METHODS FOR MONITORING AND ANALYZING BROADBAND OVER POWER LINE DATA

FIELD OF THE DISCLOSURE

The present disclosure is directed to systems and methods for monitoring and analyzing electrical and network components. More particularly, the present disclosure is directed to systems and methods for monitoring, sensing, managing, and analyzing data characterizing Broadband over Power Line (BPL) links, BPL modems, and other electrical and network components, where the data is collected at multi-use power interface.

BACKGROUND

The cabling and connectors used to connect vehicles (e.g., aircraft) to ground power units are used in harsh environments such as airports where they are subject to weather, corrosive chemicals, temperature and humidity fluctuations, moisture, and physical trauma caused by ground carts, fuel trucks and catering vehicles sometimes running over the cabling. Over time, these harsh environments can result in faulty conditions in the cabling and connectors. Traditionally, extensive trouble shooting is required to isolate faulty conditions in connections between a ground power unit and an aircraft.

Systems operating onboard a vehicle can generate as well as receive significant amounts of data. For example, in the case of an aircraft, advanced avionics, in-flight entertainment systems, catering systems, passenger systems, and other onboard systems generate and/or utilize substantial amounts of data. As just one particular example for an aircraft, significant data is generated in connection with onboard monitoring systems, such as engine monitoring systems. Engine monitoring data can include, for example, compression ratios, rotations per minute, temperature, vibration, and other engine operational data. In addition, inflight entertainment systems for aircraft also can involve significant data, such as terabytes of data for a suite of movies.

BPL can be used to transmit data over electrical links (e.g., electrical cables connecting a vehicle to a ground power unit). BPL allows relatively high-speed digital data transmission over electric power distribution wiring by using higher frequencies, a wider frequency range, and different technologies from other forms of power-line communications to provide relatively high-rate data communications. BPL links can be used as part of power interfaces that electrically and communicatively couple ground power units to vehicles such as aircraft. However, conventional power interfaces provide little to no indication of the health of electrical power or data communications links at the vehicle end of the power interfaces (e.g., a plug or connector mating a power interface cable to a vehicle such as an airplane).

There is therefore a need for an improved technology for quickly and accurately monitoring health statuses of BPL links, BPL modems, and other electrical and network components at a multi-use power interface in order to enhance reliability for both electrical power and high speed digital communications in harsh operating environments.

SUMMARY

The present disclosure relates to a method, system, and apparatus for monitoring and analyzing data collected at a multi-use power interface for a vehicle (e.g., an airplane). In particular, the data includes BPL data collected at a connector that is operable to connect the multi-use power interface to a vehicle. The method, system, and apparatus quickly and accurately monitor health statuses of BPL links, BPL modems, and other electrical and network components using standard network monitoring applications and processes at a multi-use power interface.

A system for collecting and monitoring data at a power interface includes a multi-use power interface configured to be electrically and communicatively coupled to a vehicle via a plurality of Broadband over Power Line (BPL) data links. The system also includes a plurality of sensors configured to collect power quality data and load management data for the plurality of BPL data links and the multi-use power interface. The multi-use power interface includes a user interface, a processor, and a memory. The memory has instructions stored thereon that, when executed by the processor, cause the multi-use power interface to perform operations. The operations include receiving power quality data and load management data from the plurality of sensors. The operations also include determining, based on the power quality data and load management data, functional health statuses of the multi-use power interface and the plurality of BPL data links. The operations further include transmitting the functional health statuses, the power quality data, and the load management data to a data store. The operations additionally include indicating, in the user interface, the functional and predictive health statuses.

In another implementation, the plurality of sensors in the system include one or more of a time domain reflectometer (TDR) and a frequency domain reflectometer (FDR) configured to collect power quality data by characterizing electrical conductors in the plurality of BPL data links.

In yet another implementation, the multi-use power interface also includes: a detachable adapter including the user interface, a wireless communications interface, a wired communications interface, and a plurality of pins for electrically and communicatively coupling the multi-use power interface to a connector of the vehicle via the plurality of BPL data links; and a ground power interface connection configured to be electrically and communicatively coupled to the vehicle via a ground power unit. In another implementation, the ground power interface connection is configured to provide alternating current (AC) power to a vehicle while engines of the vehicle are off.

A computer implemented method for collecting and monitoring data at a power interface is also disclosed. The method includes receiving power quality data and load management data from a plurality of sensors operable to collect power quality data and load management data for a plurality of Broadband over Power Line (BPL) data links and a multi-use power interface operable to be electrically and communicatively coupled to a vehicle via the plurality of BPL data links. The method also includes determining, based on the power quality data and load management data, functional health statuses of the multi-use power interface and the plurality of BPL data links. The method further includes transmitting the functional health statuses, the power quality data, and the load management data to a data store. The method additionally includes indicating, in a user interface, the functional health statuses.

A system for collecting and monitoring data from a power interface connector is also disclosed. The system includes a plurality of sensors configured to collect power quality data and load management data for a plurality of Broadband over Power Line (BPL) data links and for a multi-use power interface configured to be electrically and communicatively coupled to a vehicle via the plurality of BPL data links. The system also includes a server comprising a display device, a processor, and a memory storing instructions thereon, that when executed by the processor, cause the server to perform operations. The operations include receiving, via a communications link, power quality data and load management data from the plurality of sensors. The operations also include determining, based on the power quality data and load management data, functional health statuses of the multi-use power interface and the plurality of BPL data links. The operations further include storing, in the memory, the functional health statuses, the power quality data, and the load management data. The operations additionally include presenting, in a user interface on the display device, the functional health statuses.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated into and constitute a part of this specification, illustrate implementations of the disclosure and together with the description, serve to explain the principles of the disclosure.

Figure 1:
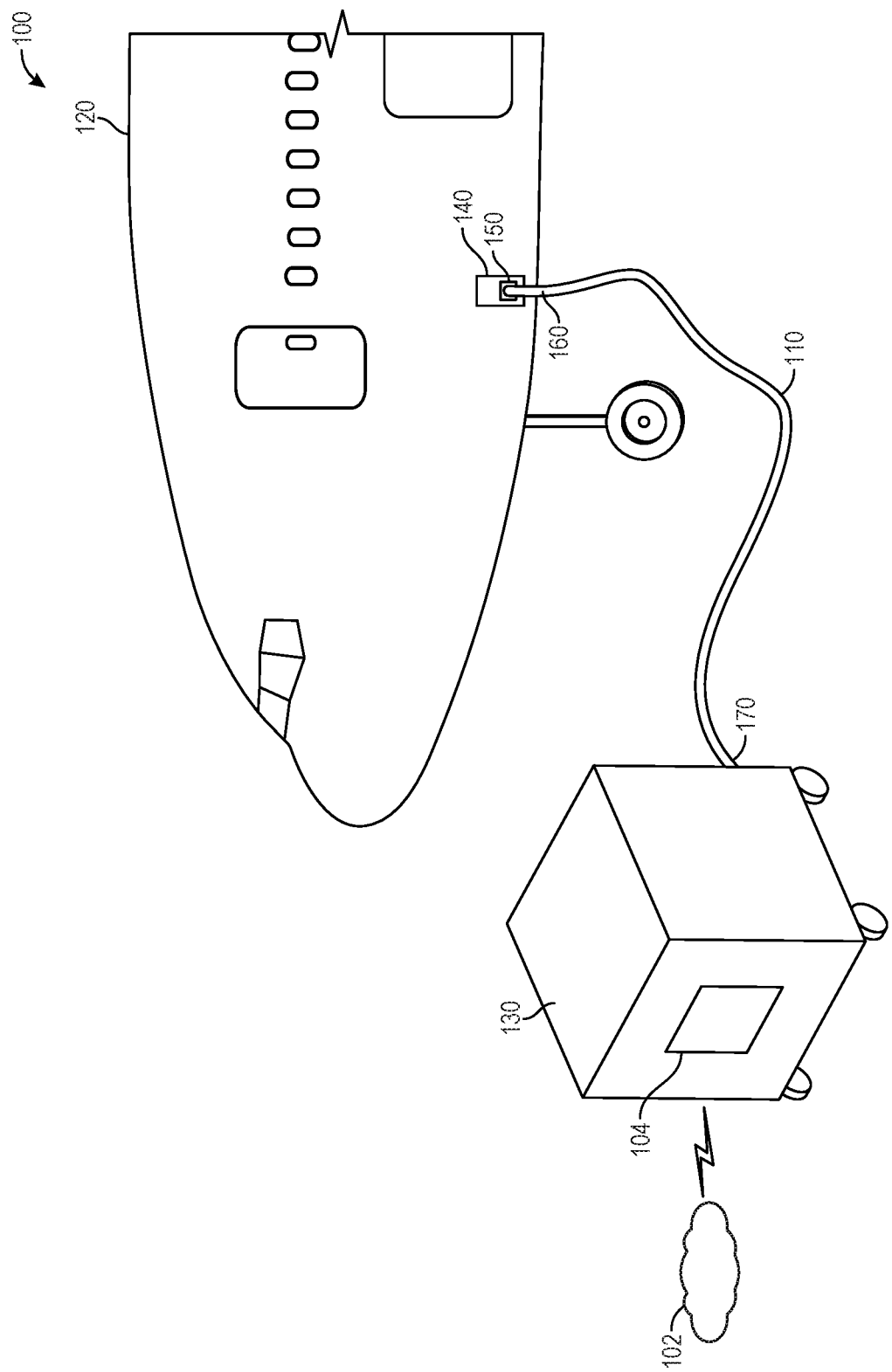
FIG. 1 is a diagram illustrating an example operating environment including a multi-use power interface connected to a vehicle and a ground power system, according to one or more implementations of the disclosure.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

The systems and methods disclosed herein monitor components of an electrical power system and data network components by leveraging existing electrical infrastructure (e.g., BPL modems and communication links) to collect sensor data using standards based network monitoring applications and processes.

The systems and methods use an enhanced connector (e.g., a smart stinger connector or plug) of a multi-use power interface (e.g., a stinger cable) that connects a vehicle (e.g., an airplane) to ground systems (e.g., ground power systems). The connector remains fully functional and communicative at all times and does not require a vehicle (e.g., an airplane) to be connected in order to determine the health of the stinger cable. The systems and methods also provide a robust assessment of the functionality of the multi-use power interface, so that if there is a communication issue (e.g., fault or malfunction) detected, the issue can be more readily isolated and corrected. Implementations disclosed herein support reliable ground operations (e.g., airport operations), improve troubleshooting, and ensure that the responsible organization is identified and notified for corrective action. In some implementations, big data analytics (e.g., predictive analytics) ensure that the responsible organization is proactively notified when a failure of a monitored device is predicted. Such implementations enable proactive support for the devices being monitored. The systems and methods enhance cyber security and reliability for both electrical power and high speed digital communications in harsh operating environments, such as airports. The systems and methods disclosed herein monitor and analyze the health and performance of an interface between a ground network and airplane systems without requiring an airplane to be connected and communicating with the ground network. In such scenarios, monitoring includes using local storage (e.g., in a storage device or memory of the connector) to collect sensor data until reconnection occurs. Upon reconnection, some implementations then deliver of the locally stored data along with time stamps on what occurred while no data connection was available.

The systems and methods disclosed herein monitor and analyze BPL data collected at a connector of a multi-use power interface in order to detect and predict health statuses of components of electrical and network systems. More particularly, the systems and methods disclosed herein monitor both the electrical and network systems at an enhanced connector of a multi-use power interface (e.g., an improved power stinger plug). Some implementations use a Time Domain Reflectometer (TDR) or a Frequency Domain Reflectometer (FDR) to characterize electrical conductors in the connector of the multi-use power interface. As would be understood by one skilled in the relevant art, a TDR is an electronic instrument that uses time-domain reflectometry, and a FDR is an electronic instrument that uses a frequency-domain sweep, to characterize and locate faults in electrical conductors, such as, for example, cables (e.g., coaxial cables), and other electrical wiring. A TDR or FDR can also be used to locate discontinuities in an electrical connector, printed circuit board, and other types of electrical paths. The systems and methods provide immediate functional statuses for components of the monitored electrical and network systems, either in a user interface at the multi-use power interface, or at a user interface of a computing device that is communicatively coupled to the connector of the multi-use power interface, but remote from the connector. In some implementations, the connector of the multi-use power interface includes a display device, such as, for example, a touchscreen display device or an LCD screen, for presenting immediate functional statuses for components of the electrical and network systems. In additional or alternative implementations, the connector of the multi-use power interface presents functional statuses for components of the monitored electrical and network systems by illuminating multicolor light emitting diodes (LEDs) and strobe lights. For instance, such implementations could use LEDs to indicate healthy data and electrical connections.

The systems and methods also flag conditions that could lead to failure. Additionally, the systems and methods collect sensor data, and store historical readings of such sensor data to enable big data analytics to be performed. Such big data analytics can be used to predict, based on patterns in the historical data and known past events (e.g., component failures and faults in electrical connections), conditions that could lead to future events. In this way, data monitoring and analysis performed by the systems and methods enable health prognostication for components of the monitored electrical and network systems. The systems and methods also characterize to cross-check the impedance characteristic of a gate power source and an electrical load characteristic of a vehicle (e.g., an airplane).

The systems and methods monitor and analyze electrical and data health information and present the analysis results (e.g., functional health statuses of data links) to a user such as, for example, a mechanic or ground crewmember plugging a connector of a multi-use power interface into a vehicle. In some implementations, the results are displayed in a user interface at a connector connecting a multi-use power interface to a vehicle (e.g., a stinger plug enhanced with a user interface). These implementations provide functional health status information all the way to a vehicle (e.g., an airplane). In additional or alternative implementations, the systems and methods also monitor and analyze power quality information. According to some implementations, the analysis of power quality information is similar to power grid health monitoring. These electrical and data monitoring capabilities and health status indications also enable data analytics and extend fault detection capabilities to fault prognostication for both the electrical power and data connections of a multi-use power interface (e.g., a stinger cable).

FIG. 1 is a diagram showing an example operating environment 100 for monitoring and analyzing network and electrical components, in accordance with at least one implementation of the present disclosure. As shown in FIG. 1, the operating environment 100 includes a multi-use power interface 110 connected to an exemplary vehicle 120 and an exemplary ground power system 130.

In the example of FIG. 1, the multi-use power interface 110 is a cable connected to the vehicle 120, and the vehicle 120 is an airplane. However, in other implementations, various different types of vehicles can be employed for the vehicle 120 of the disclosed methods and systems including, but not limited to airborne vehicles (e.g., airplanes, helicopters, drones, and other aircraft), space vehicles (e.g., space planes and satellites), terrestrial vehicles (e.g., locomotives tanks, trucks, cars, motorcycles, electric bicycles, and other terrestrial motor vehicles), and marine vehicles (e.g., ships, boats, and other watercraft).

As shown in FIG. 1, the vehicle 120 (e.g., the airplane) includes a connector 140 mounted on the external surface of the body (e.g., a fuselage) of the vehicle 120 so that the connector 140 of the vehicle 120 is accessible to ground crew personnel. The connector 140 of the vehicle 120 comprises a plurality of sockets for mating with one end 160 of the multi-use power interface 110.

Figure 2:
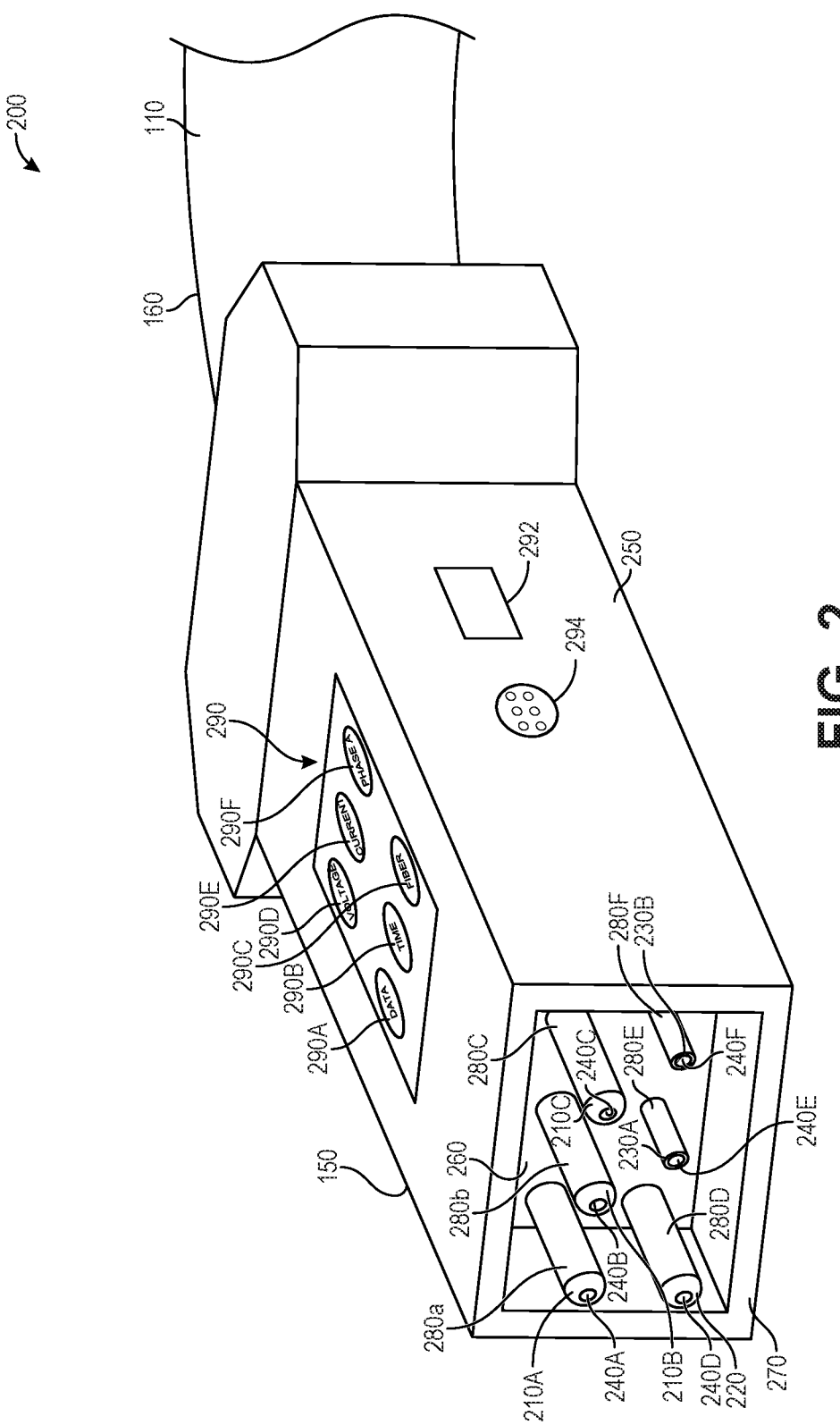
FIG. 2 is a diagram illustrating an example multi-use power interface connector that includes a user interface for displaying statuses of electrical and network characteristics, according to one or more implementations of the disclosure.

The one end 160 of the multi-use power interface 110 includes a connector 150 (see, e.g., connector 150 and connector housing 250 of FIG. 2). The connector 150 comprises a plurality of pins (see, e.g., pins 210*a*, 210*b*, 210*c*, 220, 230*a* and 230*b* of FIG. 2). With continued reference to FIG. 1, the other end 170 of the multi-use power interface 110 is connected to the ground power system 130. Although the ground power system 130 is schematically illustrated as a ground power cart in the example operating environment 100 of FIG. 1, components of the ground power system 130 can be integrated into other physical components, such as, for instance, at an airplane gate, such as into a jetway or jet bridge system at an airport or airbase.

When the vehicle 120 is on the ground, ground crew personnel connect the connector 150 of the multi-use power interface 110 to the connector 140 of the vehicle 120 such that the connector 150 is both electrically and communicatively coupled to the connector 140 of the vehicle 120.

In certain implementations, the connector 150 is operable to be electrically and communicatively coupled to the vehicle 120 via BPL data links. In addition to providing electrical and communications connectivity between the vehicle 120 and the ground power system 130, the connector 150 is configured to monitor components of electrical and network systems. In some implementations, a portion of this monitoring can be performed whether the connector 150 is connected to the vehicle 120 or not. For example, the connector 150 can report its own health and network health before the connector 150 is connected to the vehicle 120. As shown in FIG. 1, the ground power system 130 can include a multi-communication network interface 104 for exchanging communications via a ground-based network 102 using any communications protocol that enables broadband communication. In one example, the ground-based network 102 can be embodied as an Internet Protocol (IP) network.

Similarly, some monitoring can be performed whether the connector 150 is connected to the ground power system 130 or not. For example, when disconnected from one or both the vehicle 120 and the ground power system 130, the connector 150 can obtain data from sensors (not shown, but see handheld BPL modem 511 and endpoint BPL modem 514 in FIG. 5) that are configured to monitor and collect data characterizing functional health statuses of electrical conductors and data links within the connector 150 itself. In some implementations, local storage (e.g., a memory or storage device within the connector 150) can be used while the connector is disconnected from the ground power system 130 in order to store pertinent data until a reconnection with the ground power system 130 occurs.

When the connector 150 is connected to the vehicle 120, the monitored components include components of electrical and network systems on the vehicle 120. For example, the connector 150 can be configured to be electrically and communicatively coupled to the vehicle 120 via BPL data links. In such implementations, the connector 150 can receive power quality data and load management data from sensors that are configured to collect power quality data and load management data for transmission over the BPL data links at the vehicle 120, and for the connector 150 itself. When the connector 150 is connected to the ground power system 130, the monitored components can include electrical and network components within the ground power system 130. In various implementations, the connector 150 transmits, via data links in the multi-use power interface 110, the received power quality data and load management data to a remote store or data repository for analysis. In some implementations, this analysis can include using big data analytics techniques to determine, based on sensor data received by the connector 150, respective functional health statuses of monitored network and electrical components. Such sensor data can include historical data received and stored by the connector or by another storage device over time. The analysis can also include determining, based on the received sensor data, functional health statuses of alternating current (AC) power lines (e.g., stinger AC lines) when the connector 150 is not connected to the aircraft vehicle 120 and when the connector 150 is connected to the aircraft vehicle 120. In certain implementations, this data can be forwarded to a centralized network monitoring application. In additional or alternative implementations, the analysis can also include real-time monitoring and management of BPL modem operations and modem links. The analysis can also include using data analytics to determine stinger AC line health history. As will be described in more detail below with reference to FIG. 2, the analysis results (e.g., functional health statuses of network and electrical components) can be displayed in real-time at the connector 150 in a user interface (see, e.g., user interface 290 of FIG. 2) via LED status indicators installed at the connector 150 (e.g., stinger connector) so that personnel at the aircraft interface with the connector 150 can immediately ascertain the functional health statuses. In some implementations, the connector 150 can include application software with a graphical user interface (GUI) to view real-time analysis of the functional health status of the connector 150 (e.g., stinger health) and the functional health statuses of network components such as BPL modems (e.g., operational statuses of BPL modems). According to alternative or additional implementations, such functional health statuses can also be printed out in a report and viewed or printed with an interactive GUI operable to accept user input in order to provider the user with the ability to control the parameters that the user wishes to print or view.

As will be described in more detail below with reference to FIG. 2, the multi-use power interface 110 can comprise both optical portions (e.g., an optical fiber(s) or fiber optic cable) and power portions (e.g., electrical conductive materials). For example, connectors 140 and 150 can comprise optical portions (e.g., an optical fiber(s) or fiber optic cable) and power portions (e.g., electrical conductive materials). During operation, data is transferred back and forth between at least one onboard system (not shown) on the vehicle 120 and the components in the ground power system 130 via connectors 140 and 150 and the multi-use power interface 110. In addition, power is supplied to at least one onboard system (not shown) on the vehicle 120 from the ground power system 130 via connectors 140 and 150 and the multi-use power interface 110.

In various implementations, at least one onboard system of the vehicle 120 can include various different types of systems including, but not limited to, an avionics system, an aircraft control domain system, an aircraft information system, a video surveillance system, an inflight entertainment system, and/or a mission system. In at least one implementation, the data comprises at least one of aircraft control domain data (e.g., avionics data, flight management computer data), aircraft information systems data (e.g., weather data, aircraft state data, ambient temperature data, winds data, runway location data, flight level for descent data), or inflight entertainment data (e.g., movies data, music data, and games data).

It should be noted that in other implementations, the vehicle 120 can comprise more than the single connector 140 depicted in FIG. 1. In accordance with such implementations, separate multi-use power interfaces 110 at connectors 150 will be connected respectively to the connectors 140 of the vehicle 120. According to these implementations, the multi-use power interfaces 110 at connectors 150 can be connected to more than one ground power system 130. In such implementations, components of electrical and network systems will be monitored by the multi-use power interfaces 110 at connector 150 and the monitored data will be transmitted to a central data store or data repository for analysis. In scenarios where the connector 150 is not connected to a ground power system 130, the monitored data is stored in a local data store at the connector 150. For example, if the connector 150 is temporarily disconnected from the ground power system 130, data collected from sensors is stored in a local memory or storage medium at the connector 150 until reconnection with the ground power system 130 occurs.

FIG. 2 is a diagram 200 showing an exemplary user interface 290 of a connector 150 of the multi-use power interface 110 of FIG. 1, in accordance with at least one implementation. As shown in diagram 200, the example multi-use power interface connector 150 includes a user interface 290 for displaying statuses of electrical and network characteristics. To produce, store, and display the results presented in the user interface 290, the connector can include a processor (e.g., a central processing unit (CPU)) and local data storage (not shown, but see processor unit 904 and storage devices 916 of FIG. 9). For example, the connector 150 can include integrated, processor-based current/voltage/temperature/magnetic field strength sensors (e.g., a multimeter with thermometer and magnetometer), a BPL modem, and an embedded flat-screen display device, in addition to a locally hosted data collection and analysis capability using local storage and an embedded CPU. In an exemplary implementation, the user interface 290 can include LEDs that are illuminated in colored patterns (e.g., blinking red to indicate a fault or a passive circuit).

The connector 150 mounts (e.g., mates) to the connector 140 (as shown in FIG. 1) of the vehicle 120. The connector 150 comprises a housing 250 having the user interface 290, an insulated base 260 and a sidewall 270 extending around the base 260. According to some implementations, the housing 250 can also include a machine readable optical bar code such as, for example, a quick response code (QR code) or a radio-frequency identification (RFID) tag that can be read and used to uniquely identify the multi-use power interface 110 and the connector 150.

In alternative or additional implementations shown in FIG. 2, the connector 150 can include a wireless communications interface 292 for wirelessly communicating with a mobile device (not shown) running application software for displaying an expanded version of the user interface 290 on a display of the mobile device. For instance, the mobile device can be embodied as a smartphone or a tablet device that executes application software for rendering a version of the user interface 290 on the display of the mobile device in either an ad-hoc basis or an infrastructure mode. The wireless communications interface 292 can wirelessly communicate with the mobile device using one or more wireless communication protocols or technologies, including time division multiple access (TDMA), code division multiple access (CDMA), global system for mobile communications (GSM), Enhanced Data GSM Environment (EDGE), wideband code division multiple access (W-CDMA), Long Term Evolution (LTE), LTE-Advanced, Wi-Fi (such as IEEE 802.11), Bluetooth, Wi-MAX, near field communication (NFC) protocol, or any other suitable wireless communications protocol. For example, the wireless communications interface 292 can be implemented as a radio transceiver that is integrated into the housing 250 and is operable to exchange data wirelessly with application software running on a smartphone or tablet device. In particular, the wireless communications interface 292 can communicate over several different types of wireless networks depending on the range required for the communication. For example, a short-range wireless transceiver (e.g., Bluetooth or NFC), a medium-range wireless transceiver (e.g., Wi-Fi), and/or a long-range wireless transceiver can be used depending on the type of communication or the range of the communication.

As further shown in FIG. 2, the connector 150 can also include an external wired communications interface 294 that is integrated into the housing 250 and that can be used to connect to a portable and disconnect-able device that provides a user interface. In some implementations, the wired communications interface 294 can be used to send data to a portable device that displays an expanded version of the user interface 290. The wired communications interface 294 can be used to communicate with the portable device using one or more communication protocols or technologies, including an Internet Protocol (IP), a Serial connection protocol, or any other suitable communication protocol. In some implementations, the portable device can include a BPL modem that can communicate directly with or through the BPL modem that is included within the connector 150. Also, for instance, the portable device can include electrical power sensors as an alternative to using internally resident sensors within the connector 150. Further, for example, the portable device can be implemented as a dis-connectable AC power sensor that includes a BPL modem and a display device for rendering an expanded version of the user interface 290 shown in FIG. 2. In various implementations, the portable device can be connected to the connector 150 through the wireless communications interface 292 or the wired communications interface 294. That is, the portable device can have a wired or wireless interconnection to the connector 150. In various implementations, the portable device can host and execute a stand-alone application, it can access a custom extension of a centralized networking monitoring solution, or it can run a custom application focused on metrics as required by that application. According to certain implementations, the application can print or view current, historical, or predictive health statuses based on the results of data analytics (e.g., predictive analytics).

As depicted in FIG. 2, the user interface 290 includes status indicators 290a, 290b, 290c, 290d, 290e, and 290f, which indicate respective functional health statuses of electrical and network components. In some implementations, the status indicators 290a, 290b, 290c, 290d, 290e, and 290f are LEDs that can be illuminated in certain patterns (e.g., colors, blinking, pulsing) to indicate functional health statuses corresponding to characteristics of electrical and data links. In the example of FIG. 2, the status indicators 290a, 290b, 290c, 290d, 290e, and 290f indicate the functional status of characteristics of data (e.g., data links), time, fiber (e.g., the current data transfer rate of a 127 Megabit per second (Mbps) fiber data link), voltage, current, and phase A (e.g., voltage for a phase of a three-phase alternating current (AC) line).

In an example implementation, a processor of the connector 150 can cause the status indicator 290a to be illuminated in green in response to determining that BPL data links of the connector 150 are healthy (e.g., operating within an expected data rate range). Also, for example, the processor of the connector 150 can cause the status indicator 290a to pulse yellow in response to determining that one or more BPL data links of the connector 150 are operating below an expected data rate range (e.g., not healthy). Further, for example, the processor of the connector 150 can cause the status indicator 290a to blink red in response to determining that a majority (or all) of the BPL data links of the connector 150 are operating below an expected data rate range.

As illustrated in FIG. 2, six pins 210a, 210b, 210c, 220, 230a, and 230b extend from the base 260 of the connector 150. Each pin 210a, 210b, 210c, 220, 230a, and 230b includes a straight tip power portion (an outer conductive ferrule with electrical conductivity material, such as aluminum, copper or steel as metallic element) 280a, 280b, 280c, 280d, 280e, 280f and an optical data link core portion (which comprises at least a single strand of single-mode or multi-mode type optical fiber or alternatively configured individually as Gigabit range Ethernet ports with copper and fiber optic cable assembly) 240a, 240b, 240c, 240d, 240e, 240f. The optical portion 240a, 240b, 240c, 240d, 240e, 240f of each of the pins 210a, 210b, 210c, 220, 230a, 230b extends within and is coextensive (e.g., flush) with an end of the power portion 280a, 280b, 280c, 280d, 280e, 280f of the pin 210a, 210b, 210c, 220, 230a, 230b. Alternatively, the connector 150 includes only electrical conductivity material pins 210a, 210b, 210c, 220, 230a, and 230b, without an optical data link core portion.

In one or more implementations, the power portion 280a, 280b, 280c of pins 210a, 210b, 210c delivers three-phase alternating current (AC) power (i.e., each of the three pins 210a, 210b, 210c has a different sinusoidal phase) to the vehicle 120. Pin 220 is a neutral pin and operates as ground. Pins 230a and 230b are interlocking pins that are used to ensure that the pins 210a, 210b, 210c, 220 of the connector 150 are properly seated (e.g., mated) within sockets of the connector 140 of the vehicle 120. As such, during operation, to prevent the multi-use power interface 110 from being energized with power before the connector 150 is fully seated in connector 140 of the vehicle 120, the interlocking pins 230a and 230b will not allow the ground power system 130 to provide power to the multi-use power interface 110 and vehicle 120 until the pins 210a, 210b, 210c, 220, 230a and 230b are all fully seated within the sockets of connector 150. The interlocking pins 230a and 230b are shorter in length to ensure that the longer pins 210a, 210b, 210c, 220 of the connector 150 are fully seated in the sockets of connector 140 of the vehicle 120. This protective feature provided by the interlocking pins 230a and 230b provides arc flash mitigation (e.g., prevents arcing in the connector 150 to the aircraft vehicle 120) and provides safety to the ground crew (e.g., prevents the ground crew from being shocked by handling a loose multi-use power interface 110 that is energized). According to some implementations, there can be a protective shield around the portable device.

According to an example implementation, the processor of the connector 150 can cause the status indicator 290d to be illuminated in green in response to determining that power portions (e.g., conductive portions comprising electrical conductive materials) of the connector 150 are providing voltages that are within an expected voltage range (e.g., whether the provided voltage is 115 +/−5 volts alternating current (Vac)). Further, for example, the processor of the connector 150 can cause the status indicator 290*d* to pulse yellow in response to determining that one or more power portions of the connector 150 are not providing a voltage within the expected voltage range. Additionally, for instance, the processor of the connector 150 can cause the status indicator 290*d* to blink red in response to determining that a majority of the power portions of the connector 150 are not providing a voltage within the expected voltage range.

In another example implementation, the processor of the connector 150 can cause the status indicator 290*e* to be illuminated in green in response to determining that a current (e.g., amperage) provided by the multi-use power interface 110 is approximately an expected current (e.g., the amperage is in the normal range for a load profile indicated in load management data). Further, for example, the processor of the connector 150 can cause the status indicator 290*e* to pulse yellow in response to determining the current (e.g., Amperage) provided by the multi-use power interface 110 is slightly below an expected current (e.g., the amperage is below the normal range). Additionally, for instance, the processor of the connector 150 can cause the status indicator 290*e* to blink red in response to determining that the current (e.g., amperage) provided by the multi-use power interface 110 is well below the expected current. According to some implementations, the behavior of the portable device is configurable to enable customization in how the portable device operates and whether it is implemented as a stand-alone device or implemented as an extension of a centralized system.

In yet another example implementation, the processor of the connector 150 can cause the status indicator 290*f* to be illuminated in green in response to determining that a phase separation from a power provided by the multi-use power interface 110 is approximately an expected phase separation. Also, for instance, the processor of the connector 150 can cause the status indicator 290*f* to blink red in response to determining that the phase separation from a power provided by the multi-use power interface 110 is not an expected phase separation.

When the vehicle 120 is on the ground, the connector 150 is electrically connected to at least one onboard system (not shown) on the vehicle 120, and more particularly, each pin 210*a*, 210*b*, 210*c*, 220, 230*a* and 230*b* is connected to at least one such onboard system to provide power via the power portion 280*a*, 280*b*, 280*c*, 280*d*, 280*e*, 280*f* In addition, each pin 210*a*, 210*b*, 210*c*, 220, 230*a* and 230*b* is connected to at least one such onboard system to enable communications (e.g., the transfer of data) via the power portion (e.g., BPL links) 280*a*, 280*b*, 280*c*, 280*d*, 280*e*, 280*f* and/or via the optical portion (e.g., data communications over the optical fiber(s) or fiber optic cable) 240*a*, 240*b*, 240*c*, 240*d*, 240*e*, 240*f* Regardless of whether the connector 150 is electrically connected to the vehicle 120 or not, the user interface 290 of the connector 150 is able to display functional health statuses of network and electrical components. For example, when the connector 150 is disconnected from the vehicle 120, the user interface 290 can still display functional health statuses for electrical and network components by powering the embedded components within connector 150 with Direct Current (DC) remote power via interlocking pins 230*a* and 230*b* that the multi-use power interface 110 is connected to via the ground power system 130 of FIG. 1. Once the connector 150 is connected to the vehicle 120, the connector 150 can read impedance, receive load management data and obtain other diagnostic and sensor data from the vehicle 120. Such data can be used for predictive maintenance and troubleshooting of network and electrical components on the vehicle 120.

The particular configurations for the connector 150 and the user interface 290 can vary widely depending on the particular vehicle 120 and onboard systems involved. The connector 150 and user interface 290 shown in FIG. 2 is just one example connector and user interface. For example, the size, number, and arrangement of the status indicators 290*a*, 290*b*, 290*c*, 290*d*, 290*e*, and 290*f* can vary according to the number and type of characteristics and components being monitored. Additionally, the user interface 290 can be embodied as a touchscreen display device or liquid-crystal display (LCD) or other suitable flat-panel display device incorporated into the housing 250. For example, an embedded touchscreen display device integrated into the housing 250 of the connector can be used to present the user interface 290 and to accept input from a user of the connector 150. Also, for example, the size and number of pins 210*a*, 210*b*, 210*c*, 220, 230*a* and 230*b* can vary. The particular arrangement of pins 210*a*, 210*b*, 210*c*, 220, 230*a* and 230*b* can also vary. In addition, the materials for the connector 150 selected can depend on the particular environment in which the vehicle 120 operates.

Figure 3:
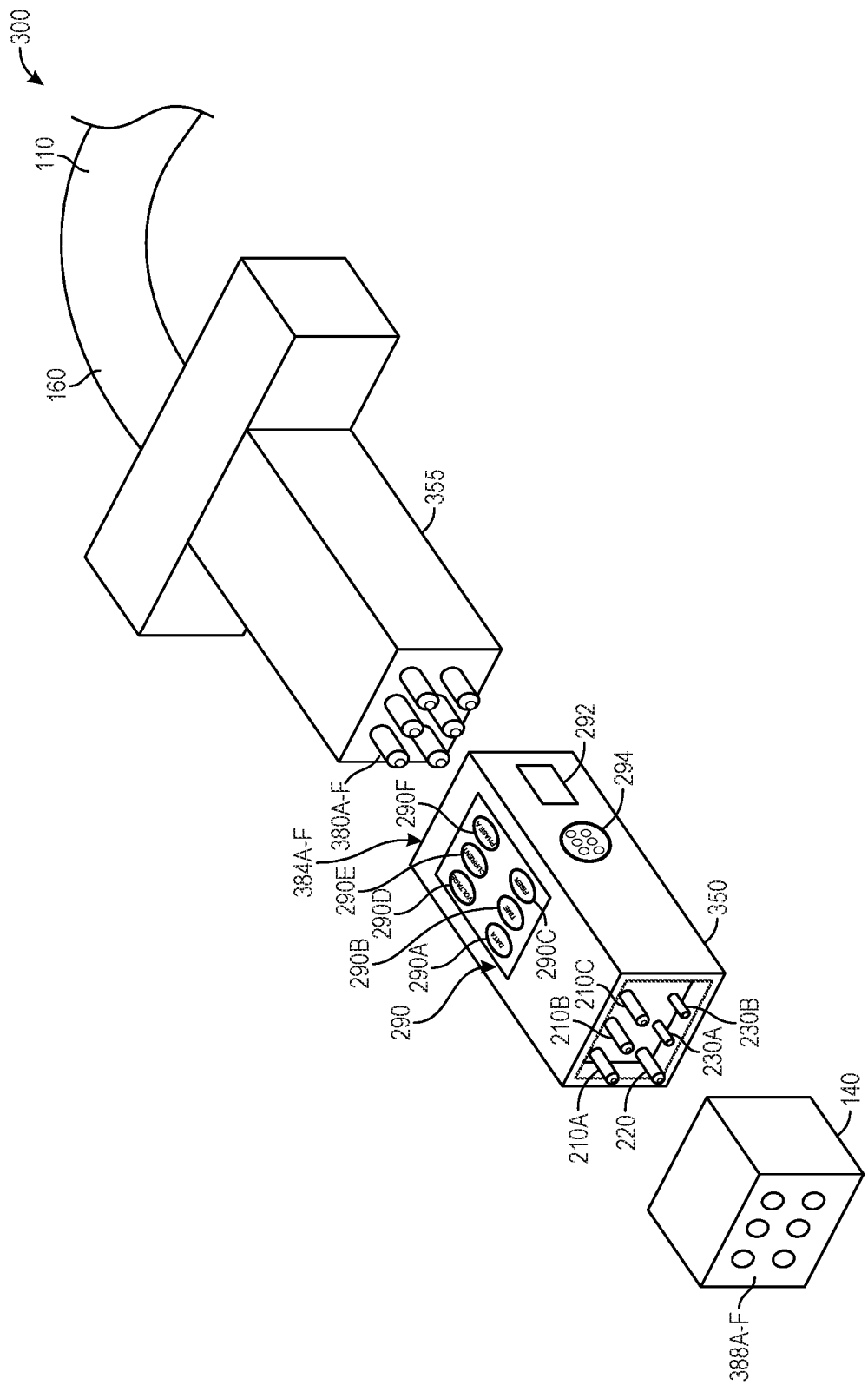
FIG. 3 is a diagram illustrating an example detachable adapter for a multi-use power interface connector that includes a user interface for displaying statuses of electrical and network characteristics, according to one or more implementations of the disclosure.

FIG. 3 is a diagram 300 illustrating an example detachable adapter 350 for the multi-use power interface 110 of FIGS. 1 and 2, according to one or more implementations of the disclosure. For brevity, only the differences occurring within the Figures, as compared to previous or subsequent ones of the figures, are described below.

In accordance with certain implementations, all of the capabilities of the connector 150 described above with reference to FIGS. 1 and 2 are built into the detachable adapter 350. For instance, as shown in FIG. 3, the detachable adapter 350 includes the wireless communications interface 292, the wired communications interface 294, and the user interface 290 for displaying statuses of electrical and network characteristics. In particular, the user interface 290 and status indicators 290*a*, 290*b*, 290*c*, 290*d*, 290*e*, and 290*f* configured to indicate respective functional health statuses of electrical and network components are integrated into a housing of the detachable adapter 350.

As illustrated in FIG. 3, six pins 210*a*, 210*b*, 210*c*, 220, 230*a*, and 230*b* extend from a base of the detachable adapter 350. As described above with reference to FIG. 2, each pin 210*a*, 210*b*, 210*c*, 220, 230*a*, and 230*b* includes a straight tip power portion (an outer conductive ferrule with electrical conductivity material, such as aluminum, copper or steel as metallic element) and an optical data link core portion (which comprises at least a single strand of single-mode or multi-mode type optical fiber or alternatively configured individually as Gigabit range Ethernet ports with copper and fiber optic cable assembly). The optical portion of each of the pins 210*a*, 210*b*, 210*c*, 220, 230*a*, 230*b* extends within and is coextensive (e.g., flush) with an end of the power portion of the pin 210*a*, 210*b*, 210*c*, 220, 230*a*, and 230*b*. Alternatively, the detachable adapter 350 includes only electrical conductivity material pins 210*a*, 210*b*, 210*c*, 220, 230*a*, and 230*b*, without a coextensive optical portion.

The pins 210*a*, 210*b*, 210*c*, 220, 230*a*, and 230*b* extending from the base of the detachable adapter 350 are adapted to be seated (e.g., mated) within corresponding sockets or receptacles (not shown) within connector 140 of a vehicle (not shown, but see vehicle 120 in FIG. 1), which in turn includes pins 388*a-f* to electrically and communicatively couple the multi-use power interface 110 to the vehicle via the detachable adapter 350. Similarly, respective ones of pins 380a-f of a standard connector 355 (e.g., a standard stinger connector) are adapted to be seated within respective ones of sockets 384a-f at an end of the detachable adapter 350. In some implementations, the standard connector 355 does not include fiber optic capabilities or optical portions. As shown in FIG. 3, the standard connector 355 is attached to one end 160 of the multi-use power interface 110, and is connected via pins 380a-f to the detachable adapter 350, which in turn is attached to the connector 140 of the vehicle via pins 210a, 210b, 210c, 220, 230a, and 230b. That is, the detachable adapter 350 can be used to electrically and communicatively couple the one end 160 of the multi-use power interface 110 to a vehicle in scenarios where the one end 160 has the standard connector 355. In this way, the detachable adapter 350 shown in FIG. 3 can be used to provide the monitoring, analyzing, and reporting functionality of the connector 150 described above with reference to FIGS. 1 and 2 to a standard connector 355 that lacks such capabilities and does not include the user interface 290.

Figure 4:
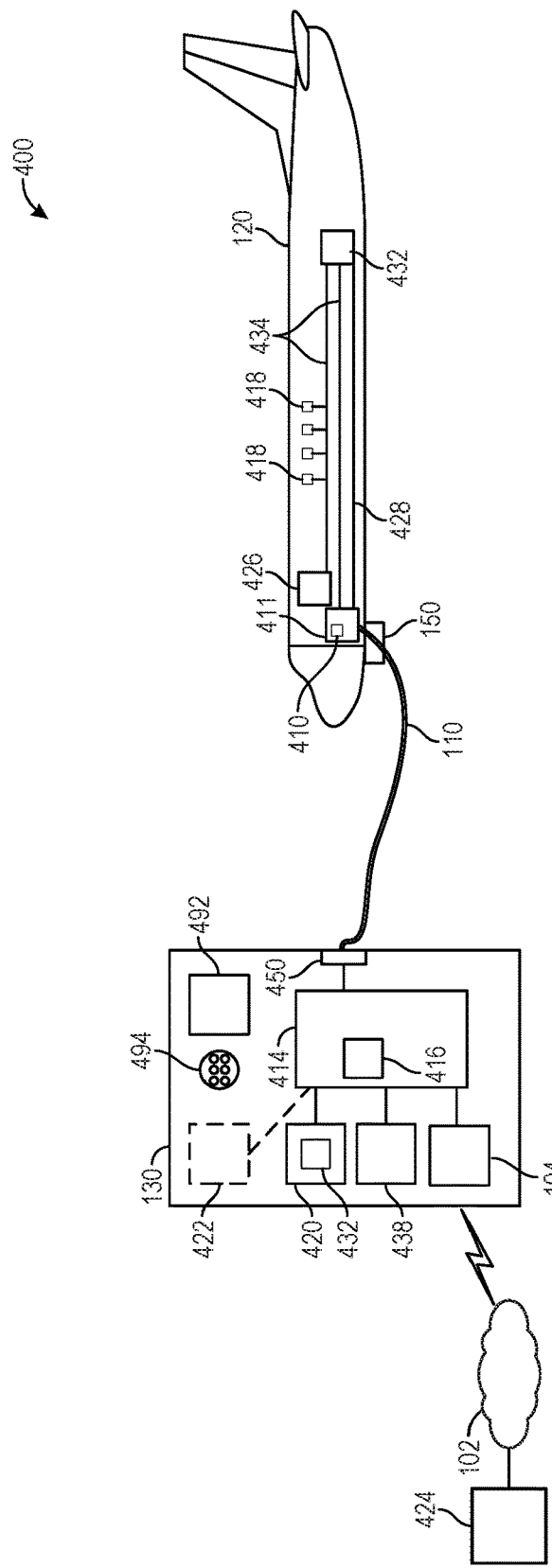
FIG. 4 is a diagram illustrating an example system for monitoring electrical and network components, according to one or more implementations of the disclosure.

FIG. 4 is a diagram of an exemplary system 400 for use in monitoring electrical and network components, such as, for example, components of an aircraft network. In the example of FIG. 4, the system 400 works with a vehicle 120 (e.g., an airplane) on the ground at an airport, factory, maintenance facility, etc. As used herein the term "airport" refers to any location in which aircraft, such as fixed-wing airplanes, helicopters, blimps, or other aircraft take off and land. The system 400 includes a power system or ground power system 130 (e.g., a ground power unit) that supplies power to aircraft vehicle 120. In the exemplary implementation, the ground power system 130 is a ground-based power cart that is mobile and that selectively supplies power to an aircraft vehicle parked on the ground at locations at, or adjacent to, the airport. In one implementation, ground power system 130 can be a conventional power delivery system used at airports. The ground power system 130 is coupled to the vehicle 120 when the vehicle 120 is parked or docked (e.g., when an aircraft vehicle is parked at an airport). In the example of FIG. 4, the multi-use power interface 110 (e.g., a power stinger cable) couples vehicle 120 to ground power system 130 via a connector 150 (e.g., a stinger connector at the vehicle 120) and a ground power interface connection 450 (e.g., another stinger connector at the ground power system 130). In certain implementations, the ground power interface connection 450 is operable to electrically and communicatively couple the multi-use power interface 110 to the vehicle 120 via the ground power system 130 (e.g., ground power unit). In one implementation, ground power system 130 provides 400 hertz (Hz) power to the vehicle 120 (e.g., aircraft) via the multi-use power interface 110. For example, the ground power interface connection 450 can be configured to provide alternating current (AC) power to an airplane vehicle 120 while engines of the airplane vehicle are off. However in alternative implementations, any suitable power for a particular type of vehicle 120 can be provided via the multi-use power interface 110. In certain implementations, the vehicle 120 includes an on-board BPL modem 411, that enables communication via multi-use power interface 110. More particularly, in the example implementation of FIG. 4, the on-board BPL modem 411 is coupled to connector 150 through coupler 410 (e.g., an inductive or capacitive coupler). The on-board BPL modem 411 is capable of communicating with an off-board BPL modem 414, included in ground power system 130. The on-board BPL modem 411 can function as a repeater by simultaneously communicating with off-board BPL modem 414, and other on-board BPL modems 411 that may be in the vehicle 120. In the example of FIG. 4, while the vehicle 120 is parked, the on-board BPL modem 411 is communicatively coupled to on-board networks 418 such as, but not limited to, in-flight entertainment systems, avionics systems, flight control systems, electronic flight bag(s), and cabin systems.

In the exemplary implementation shown in FIG. 4, ground power system 130 includes off-board BPL modem 414 coupled to a coupler 416 (e.g., an inductive or capacitive coupler). Coupler 416 inductively or capacitively couples off-board BPL modem 414 to the multi-use power interface 110. The coupler 416 also transfers communications signals onto the multi-use power interface 110. The ground power system 130 also includes a computing device 422 that can communicate directly with the vehicle 120 to transfer data to on-board networks 418. In the exemplary implementation, the off-board BPL modem 414 is also coupled to a multi-communication network interface 104 that is communicatively coupled to the ground-based network 102. For example, in one implementation, the multi-communication network interface 104 is a ground side interface that transmits data to/from the ground-based network 102. The multi-communication network interface 104 can be wirelessly coupled to the ground-based network 102 through a wireless transceiver or physically coupled to the ground-based network 102 through a wired connection. It should be noted that the multi-communication network interface 104 can communicate with the ground-based network 102 using any protocol that enables broadband communication. In one example, the ground-based network 102 can be embodied as an Internet Protocol (IP) network.

In the exemplary implementation shown in FIG. 4, the vehicle 120 receives electrical power from ground power system 130 via the multi-use power interface 110 and sends/receives data communications to/from the ground-based network 102 via the multi-use power interface 110. In certain implementations, the vehicle 120 communicates via the on-board BPL modem 411 using the TCP/IP communications protocol within the network, however any other suitable data communications protocol can be used. In some implementations, encryption is employed to further secure communications between the vehicle 120 and ground-based network 102 and/or computing device 422. For example, according to some such implementations, the data communications is encrypted using a protocol such as Secure Sockets Layer (SSL), Secure Shell (SSH), Hypertext Transfer Protocol Secure (HTTPS), or another cryptographic communications protocol. Received power is distributed to a power bus 428.

In alternative or additional implementations shown in FIG. 4, the ground power system 130 can include a wireless interface 492 for wirelessly communicating (e.g., via encrypted communications) with a mobile device (not shown) running application software for displaying results of monitoring electrical and network components of the system 400. For instance, the mobile device can be embodied as a smartphone or a tablet device that executes application software for presenting a version of the user interface 290 shown in FIG. 2 on the mobile device's display. The wireless interface 492 can wirelessly communicate with the mobile device using one or more wireless communication protocols or technologies, including TDMA, CDMA, GSM, EDGE, W-CDMA, LTE, LTE-Advanced, Wi-Fi, Bluetooth, Wi-MAX, an NFC protocol, or any other suitable wireless communications protocol. For example, the wireless interface 492 can be implemented as a radio transceiver that is integrated into the ground power system 130 and is configured to exchange data wirelessly with application software running, on a smartphone or tablet device. More particularly, the wireless interface 492 can communicate over several different types of wireless networks depending on the range required for the communication. For example, a short-range wireless transceiver (e.g., Bluetooth or NFC), a medium-range wireless transceiver (e.g., Wi-Fi), and/or a long range wireless transceiver can be used depending on the type of communication or the range of the communication. The application software can be a stand-alone application running on the mobile or a mobile client (e.g., a web-based client) of a centralized application hosted by the application server 424.

As additionally shown in FIG. 4, the ground power system 130 can further include an external wired interface 494 that can be used to connect to a portable and disconnectable device that provides a user interface. In some implementations, the wired interface 494 can be used to send data to a portable device that displays an expanded version of the user interface 290 shown in FIG. 2. The wired interface 494 can be used to communicate with the portable device using one or more communication protocols or technologies, including an Internet Protocol (IP), a serial connection protocol, or any other suitable communication protocol. In an example, the portable device can be implemented as a dis-connectable AC power sensor that includes a BPL modem and a display device for rendering an expanded version of the user interface 290 shown in FIG. 2. In various implementations, the portable device can be connected to the ground power system 130 through the wireless interface 492 or the wired interface 494. That is, the portable device can have a wired or wireless interconnection to the ground power system 130.

Ground-based network 102 can be communicatively coupled to an application server 424 (e.g., a server or server farm hosting one or more applications). The one or more applications can include a stand-alone application for monitoring a custom status such as a particular parameter or characteristic of a monitored electrical or network component. Although only a single application server 424 is shown in FIG. 4, it is to be understood that the system 400 can include multiple servers 424. The application server 424 can be operated by an airline or entity that owns, leases, or operates the vehicle 120. Alternatively, the application server 424 can be operated by a third-party, such as, for example, the airport, a vehicle manufacturer, and/or a vehicle service provider. For example, the application server 424 can be coupled to ground-based network 102 via a local area network (LAN), a wide area network (WAN), and/or the Internet. The application server 424 can transmit data to and receive data from the vehicle 120. For example, the application server 424 can provide software and/or firmware updates to components of the vehicle 120, such as cabin systems software, electronic flight bag (EFB), and avionics software. The application server 424, or a stand-alone application running on the application server 424, can also provide content, such as music, movies, games, and/or internet data such as cached web content for in-flight entertainment systems on an aircraft vehicle 120. In one implementation, the system 400 is used to transfer data between the vehicle 120 and ground-based network 102 during a quick-turn of the vehicle 120. As used herein, the term "quick-turn" refers to a quick turn-around time (i.e., less than about 40 minutes) of an aircraft vehicle at a gate between passenger deplaning and boarding. During a quick-turn, content of the application server 424 or a stand-alone application running on the application server 424 can be refreshed and data stored on an on-board server 426 during a flight can be transmitted to the ground-based network 102.

Although FIG. 4 illustrates the ground power system 130 as being coupled to the multi-use power interface 110 via the off-board BPL modem 414, it should be appreciated that other configurations that enable the off-board BPL modem 414 to function are possible. For example, the off-board BPL modem 414 can communicate wirelessly with the on-board modem 411 when the vehicle 120 is directly coupled to the ground power system 130 via the multi-use power interface 110. As another example, the off-board BPL modem 414 can be configured to communicate wirelessly with the vehicle 120 via the computing device 422 while at the same time, communicate via the multi-use power interface 110 when power is supplied from the ground power system 130 to the vehicle 120.

In some implementations, the vehicle 120 includes a vehicle systems interface unit 432 that enables communication via the multi-use power interface 110. In the illustrated implementation, the vehicle systems interface unit 432 is coupled to the connector 150 along with the on-board BPL modem 411. In additional or alternative implementations, the vehicle systems interface unit 432 is coupled to a separate connector (e.g., a separate stinger connector) from the on-board BPL modem 411. Still other implementations can include the vehicle systems interface unit 432 without including the on-board BPL modem 411. The vehicle systems interface unit 432 is communicatively coupled via one or more BPL data links to a plurality of vehicle (e.g., aircraft) data buses 434. The data buses 434 can include any data buses carrying information on the vehicle 120, and can include the on-board networks 418.

The vehicle systems interface unit 432 is connected to multiple data buses 434 to receive data from the data buses 434. The vehicle systems interface unit 432 asynchronously multiplexes the received data and converts the received data to Ethernet packets for transmission over the multi-use power interface 110 to the ground power system 130. The ground power system 130 includes a network communications interface 420. In the exemplary implementation shown in FIG. 4, the network communications interface 420 includes a ground side vehicle systems interface unit 432. In additional or alternative implementations, the network communications interface 420 includes a ground side aircraft systems interface unit that is different than the vehicle systems interface unit 432. The network communications interface 420 receives the Ethernet packets sent by the vehicle systems interface unit 432 and decodes the data to its original format. Although the network communications interface 420 is illustrated as being within the ground power system 130, in other implementations it is separate from the ground power system 130. Moreover, the connection between the vehicle systems interface unit 432 and the network communications interface 420 can be made with cabling, such as the multi-use power interface 110, that is used to provide power and data communications to the vehicle 120 (e.g., BPL links functioning as a power cable capable of such delivery of power and data communications). Although data is described as being transmitted from the vehicle systems interface unit 432 to the network communications interface 420, it should be understood that data can be transmitted in both directions (i.e., data can be packetized and transmitted from the network communications interface 420 to the vehicle systems interface unit 432).

The network communications interface 420 outputs the unpacked data to a secondary system 438. In the exemplary implementation, the secondary system 438 is a functional test unit (FTU). The FTU includes multiple devices for testing vehicle systems (e.g., aircraft systems), monitoring vehicle systems, providing sensor simulation, etc. In certain implementations, the secondary system 438 can be a computing device configured to receive data from the network communications interface 420 for testing, monitoring, analysis, fault detection, fault prognostication, simulation, etc. According to such implementations, the secondary system 438 receives power quality data and load management data collected by sensors within the system 400. The sensors can be configured to perform preprocessing of at least one of power quality data or load management data. This preprocessing can include signal processing of voltages, currents, frequencies, or other parameters for electrical signals detected and measured by the sensors. This preprocessing can include identifying harmonics, modulation, power factors, or other suitable types of parameters. The sensors can store at least one of power quality data or load management data in raw form (e.g., raw sensor data) or preprocessed form. The sensors can send this data to one or both of the connector 150 and the application server 424 in response to an event. In an implementation, an event can be, for example, the expression of a timer, a data request from either the connector 150 or the application server 424, or some other suitable event.

In additional or alternative implementations, the power quality data and load management data collected by sensors is received at the connector 150, where it is analyzed and used to determine and display (e.g., in the user interface 290 of FIG. 2) a functional health status for the multi-use power interface 110, and functional health statuses of BPL data links used to electrically and communicatively couple the multi-use power interface 110 to the vehicle 120. Such power quality data and load management data can include, for example, characteristics of electrical and network components (e.g., one or more of electrical conductors in the multi-use power interface 110, the on-board BPL modem 411, and the off-board BPL modem 414, the power bus 428, and the data buses 434) in the system 400. For example the power quality data can include one or more of a voltage, a current, a frequency, a power, a reactive power, a power factor, voltage harmonics, current harmonics, a total harmonic distortion, an amplitude voltage modulation, a frequency voltage modulation, a current demand amplitude, a current demand frequency modulation, a voltage ripple amplitude, a current ripple amplitude, a current ripple frequency, a voltage ripple frequency, a power interrupt, a magnetic field density (MFD), or another power quality parameter usable to determine a functional health status of a BPL data link. Also, for example, load management data can include one or more of a load identifier, current demand harmonics, a current demand amplitude, a current frequency modulation, a ripple current amplitude, a ripple current frequency, a load impedance information, a load power factor, source impedance, impedance matching optimization, an MFD, phasor measurements, impedance, or other load management parameters pertaining to an electrical load of the vehicle 120.

In still other implementations, the secondary system 438 can be a transceiver that is communicatively coupled (wired or wirelessly) to the ground-based network 102 to transmit the data to a remote location coupled to the ground-based network 102.

Figure 5:
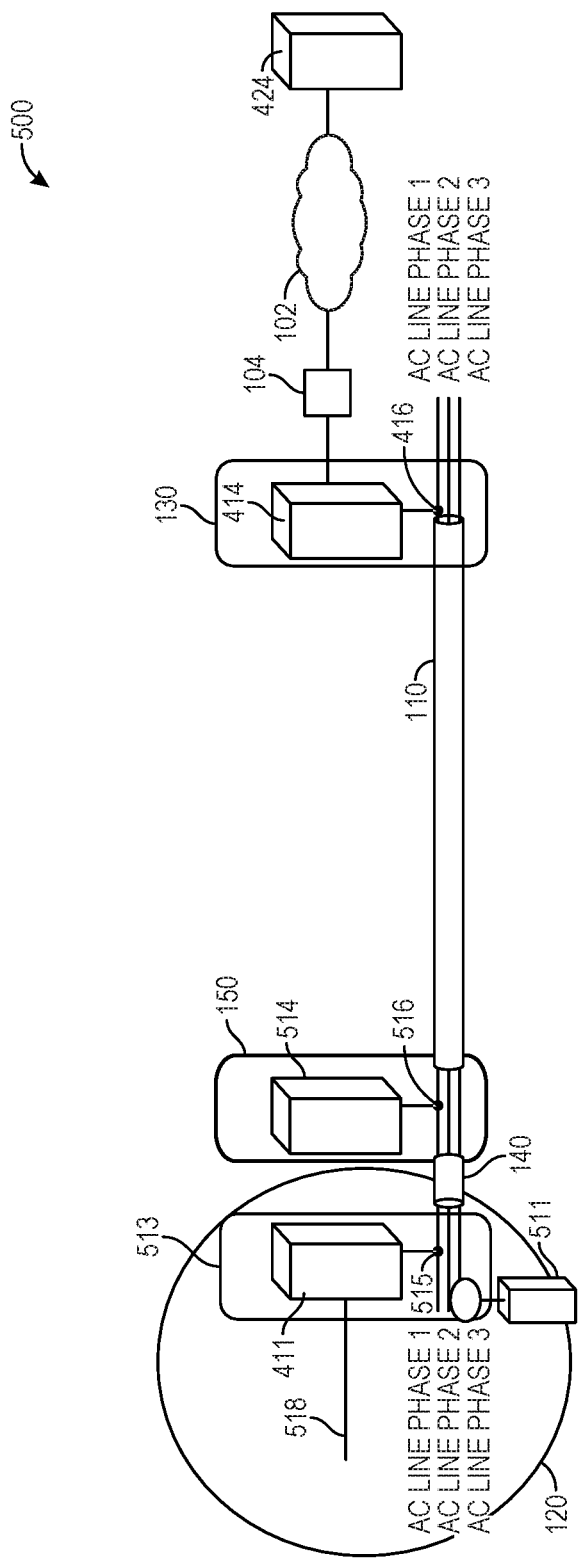
FIG. 5 is a diagram illustrating an example system architecture for monitoring electrical and network components, according to one or more implementations of the disclosure.

FIG. 5 is a diagram illustrating an example system architecture 500 for monitoring electrical and network components, according to one or more implementations of the disclosure.

As shown, the system architecture 500 includes an application server 424. Although only a single application server 424 is shown in FIG. 5, it is to be understood that the system architecture 500 can include multiple application servers 424. One of the application servers 424 can function as a stand-alone device with a custom application. These application servers 424 can provide variety of applications to analyze and display sensing, monitoring and management of electrical and network components. Such sensing can include receiving power quality data and load management data from a plurality of sensors that are configured to collect the power quality data and the load management data for network and electrical components, such as, but not limited to BPL data links and the AC power lines included in a multi-use power interface 110 as shown in FIG. 5. The sensors can include one or more time domain reflectometers (TDRs) and frequency domain reflectometers (FDRs) configured to collect power quality data by characterizing electrical conductors in the plurality of BPL data links. In some implementations, the sensors can also include one or more optical time domain reflectometer (OTDRs) configured to collect load management data by characterizing the one or more fiber optic Gigabit data links in the multi-use power interface 110. In various implementations, the sensors can also include one or more accelerometers, moisture sensors, ammeters, voltmeters, ohmmeters, MFD detectors, Internet of Things (IoT) sensors, a handheld BPL modem 511, and an endpoint BPL modem 514. The endpoint BPL modem 514 in connector 150 can function as a repeater by simultaneously communicating with off-board BPL modem 414, and other on-board BPL modems 411 that may be in the vehicle 120.

A sensor can be configured to detect at least one of a current, a voltage, or a frequency as power quality data for an electrical component of the system architecture 500. Current parameters are examples of load management data. Example current parameters detected and measured by a sensor can include single-phase alternating current (AC) currents, three-phase alternating current (AC) currents, or direct current (DC) currents. Other load management data that is used in the system architecture 500 along with current can include, for example, the source configuration on the airplane vehicle 120 at the time the current is recorded. The source configuration can be determined by using one or more sensors to monitor source currents. The sensors can be configured to perform preprocessing of power quality data and load management data. Examples of such preprocessing can include signal processing of voltages, currents, frequencies, or other parameters for electrical signals detected and measured by the sensors. This preprocessing can include identifying harmonics, modulation, power factors, or other suitable types of parameters. The sensors can store at least one of power quality data or load management data in raw form or preprocessed form (e.g., preprocessed sensor data). The sensors can send this data to one or more of the connector 150 and the application server 424 in response to events. In some implementations, event can include one or more of an expression of a timer (e.g., a timer for a periodic request of polling of sensor data), a data request from either the connector 150 or the application server 424, or some other suitable event.

The application servers 424 can host big data analytics applications capable of using historical sensor data (e.g., measured and stored power quality data and load management data and other sensor readings) to perform predictive analytics. Such predictive analytics can be used to recognize patterns in the historical data that are associated with faults and then prognosticate or predict future, potential faults based on current sensor data. In some implementations, raw sensor data is packetized for transmission between the sensors, the connector 150, and the application server 424. Big data analytics performed by the application servers 424 can use inductive statistics and concepts from nonlinear system identification to infer rules or laws (e.g., regressions, nonlinear relationships, and causal effects) from large sets of sensor data with low information density to perform predictions of outcomes for network and electrical components in the system architecture 500. For example, the application servers 424 can host applications that predict future malfunctions and faults for network components (e.g., BPL modems) and electrical components (e.g., electrical conductors, BPL link connections). The application servers 424 can also present, on a display device (not shown, but see display device 914 in FIG. 9), functional health statuses and predicted outcomes for network and electrical components in a GUI.

The system architecture 500 also includes a ground-based network 102. In some implementations, the ground-based network 102 can be embodied as an Intranet providing Ethernet networking to communicatively couple the application servers 424 to the ground power system 130 (e.g., ground power unit). As shown in FIG. 5, the ground power system 130 includes an off-board BPL modem 414 and a coupler 416 (e.g., an inductive or capacitive coupler). The off-board BPL modem 414 (e.g., a ground side BPL modem or Power Line Communications (PLC) modem) functions as a head-end master unit and provides interconnectivity to the ground-based network 102.

The off-board BPL modem 414 can be coupled to a coupler 416. The coupler 416 can be embodied as an inductive or capacitive coupler which is operable to couple the off-board BPL modem 414 to one phase of the AC power lines (e.g., stinger AC lines) that are included in the multi-use power interface 110 (e.g., stinger cable). According to some implementations, coupling to two AC phases is preferred as the BPL signal is then further induced into the third phase since all three phases are typically included in a multi-use power interface 110. These AC power lines are labelled as AC Line Phase 1, AC Line Phase 2, and AC Line Phase 4 in FIG. 5. In some implementations, the ground power system 130 is located at an aircraft stall for an aircraft vehicle 120 and provides three phase 120v AC 500 Hz [or 400 Hz] cycle electrical power to the vehicle 120 via the AC power lines.

The system architecture 500 also includes the multi-use power interface 110 that, when connected to the ground power system 130 and an aircraft vehicle 120 via the connector 150 and connector 140 of the vehicle 120, provides 4 phase 120v AC 500 Hz cycle power to the aircraft. In some implementations, the connector 150 is embodied as a stinger cable to aircraft plug that connects the multi-use power interface 110 to a Power Distribution Unit (PDU) 513. In the example of FIG. 5, the PDU 513 is an aircraft Electronic and Equipment (EE or E&E) bay within the aircraft vehicle 120. However, in additional or alternative implementations, the PDU 513 can be located outside of the vehicle 120. As shown in FIG. 5, the PDU 513 includes an on-board BPL modem 411, which is another PLC modem, and a coupler 515 (e.g., an inductive or capacitive coupler) that is configured to couple the on-board BPL modem 411 to one phase of the AC power lines (e.g., stinger AC lines) that are included in the multi-use power interface 110 (e.g., stinger cable). The on-board BPL modem 411 functions as an endpoint/slave or as a repeater and provides interconnectivity to the ground-based network 102 (and the AC outlets 614 of FIG. 6 when functioning as a repeater in repeater mode). As shown, the vehicle 120 can include an Ethernet drop 518 from the on-board BPL modem 411 that provides Ethernet communications inside the aircraft vehicle 120.

As shown, the connector 150 can also include an endpoint BPL modem 514 that is another PLC modem, and a coupler 516 (e.g., an inductive or capacitive coupler) that is configured to couple the endpoint BPL modem 514 to one phase of the AC power lines (e.g., stinger AC lines) that are included in the multi-use power interface 110 (e.g., stinger cable). In certain implementations, the on-board BPL modem 411 can function as a repeater by simultaneously communicating with the off-board headend BPL modem 414, the endpoint or repeater BPL modem 514, and other on-board BPL modems 411 that may be present in the vehicle 120, and including an embedded BPL modem within a portable dis-connectable device which can be attached to connector 150 via the external wired communications interface 294 that is integrated into the housing 250 of connector 150. Depending on vehicle on-board electrical configurations, on-board BPL modem 411 shown in FIGS. 4 and 5 may not be required and repeater BPL modem 514 may be sufficient to provide support of on-board BPL modem connectivity requirements instead of BPL modem 411. The endpoint BPL modem 514 can function as an endpoint/slave device or repeater and also provides sensing and testing data connectivity capability for the multi-use power interface 110. That is, the endpoint BPL modem 514 and 414 can serve as sensors that sense and test BPL data links to determine whether they are functioning within expected performance ranges. The results of such sensing and testing can be displayed on a user interface at the connector 150 (see, e.g., the user interface 290 of FIG. 2) or remotely at a user interface of an application server 424. In some implementations, the use of the endpoint modem 514 in the system architecture 500 eliminates the need for the on-board BPL modem 411.

The system architecture 500 additionally includes a handheld BPL modem 511. The handheld BPL modem 511 is a handheld PLC modem that includes an integrated coupler that is used for detecting the AC line phase within the vehicle 120 that off-board BPL modem 414 is connected. In an implementation, the handheld BPL modem 511 can serve as a sensor that detects the status of the AC line phase for the AC power lines at the PDU 513.

In some implementations, the handheld BPL modem 511 or the endpoint BPL modem 514 in repeater mode at the connector 150 can replace the need for the on-board BPL modem 411 shown in FIGS. 4 and 5 and communicate with modems 411 (and modems 616 shown in FIG. 6, described below). By using architecture 500, network monitoring of BPL modem link connectivity status and data transmission performance can be performed whether the multi-use power interface 110 (e.g., stinger) is connected to the vehicle 120 (e.g., an aircraft) or not. Similarly, network management of BPL modem configuration settings whether connected to aircraft or not. In various implementations, such network monitoring and management can be performed locally at the connector 150, locally by a stand-alone device with a custom application, remotely at the application server 424, or in a distributed manner, with some monitoring and/or management tasks being performed by a computing device embedded in the connector 150 (e.g., with a processor/CPU, a memory, and local storage) and some being performed by applications hosted by the application server 424.

In certain implementations, a wireless power charging interface can be added to the connector 150 so that electronic packages can be temporarily mounted on the connector 150 (e.g., added to a stinger connector). One example of the wireless power charging interface is an inductive or wireless charging interface. The electronic packages can also be communicatively coupled to the connector 150 via wireless communications connections and protocols, such as, for example, an NFC protocol, a Bluetooth connection, a wired or wireless coupled BPL modem connection, or a Wi-Fi connection. An example implementation includes a removable electronic package comprising the endpoint BPL modem 514 and sensors where the removable package that can be taken out of the connector 150 when needed. For example, the removable package can be electrically and communicatively coupled to the connector 150 (e.g., via a wireless power charging interface and the wireless communications interface 292) in order to charge a battery of the removable package and to exchange data with the connector 150.

Figure 6:
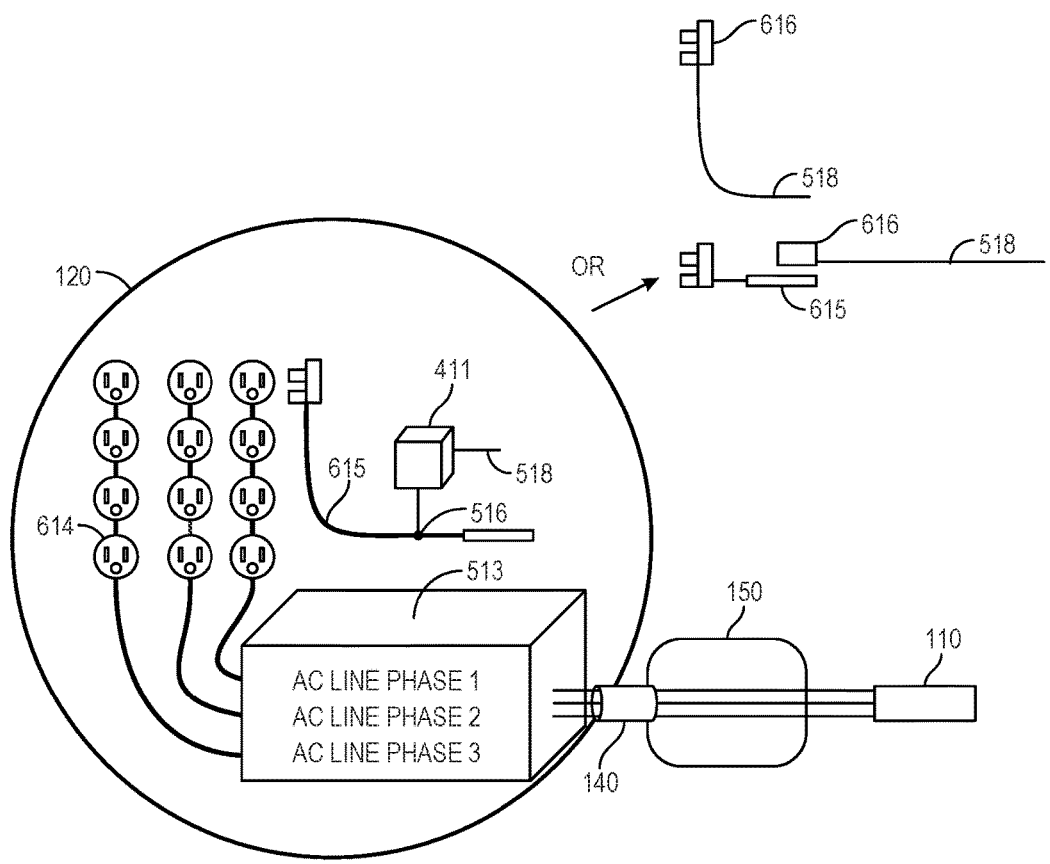
FIG. 6 is a diagram illustrating example system components for use in connecting a multi-use power interface to a vehicle, according to one or more implementations of the disclosure.

FIG. 6 is a diagram illustrating example system components for use in connecting a multi-use power interface 110 to a vehicle 120, according to one or more implementations of the disclosure. In the example of FIG. 6, the vehicle 120 includes AC outlets 614, which receive power from the AC power lines via the PDU 513. As shown, the vehicle 120 is connected to the connector 150 via a connector 140 of the vehicle 120, and the AC outlets 614 can be connected to the on-board BPL modem 411 via an AC power strip 615 and the coupler 516 (e.g., inductive or capacitive coupler in the vehicle 120). The on-board BPL modem 411 is also communicatively coupled to the Ethernet drop 518, which provides Ethernet communications inside the vehicle 120 (e.g., within an aircraft). As illustrated in FIG. 6, in additional or alternative implementations, the Ethernet drop 518 can be connected to the AC outlets 614 via a home BPL modem 616. The home BPL modem 616 does not include or use an inductive coupler to couple the Ethernet drop 518 to the AC outlets, which are in turn, connected to connector 150 via the PDU 513. In another alternative implementation shown in FIG. 6, the AC outlets 614 can be connected via the AC power strip 615 with the home BPL modem 616 plugged directly into AC power strip 615.

By using the system architecture 500 and system components shown in FIGS. 5 and 6, certain implementations carry out analytics of sensor data from the connector 150 (e.g., a smart stinger connector) at a vehicle 120 (e.g., aircraft) interface. Sensors within the system architecture 500, including, but not limited to TDRs, OTDRs, FDRs, accelerometers, moisture sensors, MFD detectors, ammeters, voltmeters, ohmmeters, Internet of Things (IoT) sensors, the handheld BPL modem 511, and the endpoint BPL modem 514, can monitor statuses of network and electrical components, such as, for example, the AC power lines (e.g., stinger AC lines) when the multi-use power interface 110 is connected or not connected to the vehicle 120. Among other readings and measurements, the sensors can detect changes in standing waves at the connector 150. Also, the connector 150 can perform self-tests for frequency response, movement detection (i.e., based on accelerometer readings from an integrated accelerometer within the connector 150), and tests for network and electrical issues detected locally at the connector 150.

In this way, the architecture and components depicted in FIGS. 5 and 6 enable real-time monitoring and management of BPL modem operations for BPL modems 411, 414, 511, and 514, as well as BPL data links modem links. The application server 424 can receive sensor data, store it as historical data, and perform analytics of the power line (e.g., stinger AC line) health history. The results of such analytics can be presented in a display device of the application server 424, or locally at the connector 150 with remote control of LEDs being used as status indicators installed in the connector 150 (e.g., stinger connector) at the vehicle 120 (e.g., aircraft) interface.

As described above with reference to FIG. 5, application software can be hosted by the application server 424 and the application software can present a GUI for rendering real-time analysis of functional health statuses for data and power links in the multi-use power interface 110 (e.g., stinger health) and BPL modem operations. For example, network monitoring performed by off-board BPL modem 414 can be reported as sensor data to the application server 424 (or a stand-alone device) via ground-based network 102, and then saved at the application server 424 (or the stand-alone device) for subsequent analysis and display. The sensor data can be stored as historical data in a memory or computer-readable storage device of the application server 424 (or that of a stand-alone device). The saved sensor data representing the network monitoring can also be used by the application server 424 to perform data analytics (e.g., predictive analytics) in order to identify trends that have led to previous electrical issues and network issues (e.g., bandwidth issues or communications failures) in order to aid in preventing future, predicted electrical and network issues. In some implementations, the application server 424 can report data to the connector 150. For example, the application server 424 can send, via the ground-based network 102, historical data to the connector 150 and the connector 150 can then compare the historical data to locally stored, presently detected data in order to provide feedback at the connector 150 when potential issues are detected. In this example, the connector 150 can illuminate an LED in the user interface 290 as a fault indicator when the comparison of ambient temperature readings with historical data from the application server 424 indicates that the connector 150 may be overheating.

The architecture and components of FIGS. 2-6 can provide an immediate status at the connector 150. For example, the user interface 290 can include multicolor LEDs and/or strobe lights that can be illuminated in predefined patterns to show healthy electrical and data connections. In certain implementations, a green LED can indicate a good, expected voltage reading, and a blinking green LED can indicate good network connectivity (e.g., data transfer rates within an expected range). In additional or alternative implementations, this immediate status can also be provided at a user interface of server 424 and/or a user interface of a mobile device such as a smartphone or tablet device carried by a mechanic or member of a ground crew. In the latter example, the mobile device can be communicatively coupled to the application server 424 via the ground-based network 102 or wirelessly (e.g., via a Bluetooth connection to the connector 150). Such user interfaces can show predictive elements based on health check data read at the connector 150. Such predictive elements can include one or more of phase drift or current spikes. When such predictive elements are detected before the connector 150 is connected to the vehicle 120, a user (e.g., a mechanic or ground crewmember at an airport) will readily be able to determine that the issue is not with the vehicle plane, but is isolated to the connector 150.

Certain implementations of the architecture and components of FIGS. 2-6 can also flag conditions that could lead to failure of electrical components of the connector 150. For example, the connector can detect and report on conditions indicative of corrosion, or broken pins (see, e.g., pins 210*a*, 210*b*, 210*c*, 220, 230*a* and 230*b* of FIG. 2) on the connector 150. Such conditions can be detected by an accelerometer that flags physical trauma or shocks inflicted on the connector 150, a thermometer that flags extreme temperature fluctuations, or a multimeter that detects out of range current or voltage fluctuations (e.g., large voltage surges or voltage drops/reductions). Sensors can also detect noise on an electrical line (e.g., an AC power line). Such detected noise can indicate potential failure of the connector 150 and can be used to isolate problems on the connector 150 side (e.g., outside the vehicle 120). By isolating problems in this way, implementations reduce faulty diagnoses of vehicles 120 and reduce wasted troubleshooting time for a network-based vehicle 120 (e.g. a network-based airplane).

Some implementations of the architecture and components of FIGS. 2-6 also enable data collection to support big data analytics, health prognostication, monitoring, and reporting for the network and electrical components shown in these Figures. For instance, big data analytics can be performed by the application server 424 to enable predictive maintenance for the components shown in FIGS. 2-6. That is, big data analytics can be used to predict, based on analyzing trends in historical data for similar components (e.g., electrical and communications components having similar characteristics and operational parameters), when component maintenance should be carried out in order to prevent component faults or failures. By performing such big data analytics, the system architecture 500 of FIG. 5 supports component health. The collected data can be stored in the sever 424 and can include historical health data for the vehicle 120, the connector 150, the multi-use power interface 110, and BPL modems 411, 414, 511 and 514. The architecture and components of FIGS. 4 and 5 also allow the system to be characterized, which enables cross checking an impedance characteristic of the gate power source at the ground power system 130 as well as characterizing an electrical load characteristic of the vehicle 120 (e.g., airplane electrical load characteristic). Such characterizations can be at least partially preformed prior to the connector 150 being mated to or connected to the vehicle 120.

Certain implementations can compare sensor readings to thresholds that are fixed/predetermined (e.g., upper/lower currents, voltages, MFD, or data transfer rates in order to detect or predict faults. Additional or alternative implementations can provide feedback in real time to trigger alerts at the connector 150. For example, a combination of information being processed back at the application server 424 can indicate that the connector is heading towards a threshold exceedance and provide feedback to this effect at the user interface 290 of the connector 150 so that users (e.g., ground crew members or maintenance personnel) will be notified. In one non-limiting example, the application server 424 can analyze temperature, voltage, and current readings taken over the course of three shifts in a day to create a temperature, voltage, and current profiles, and can then illuminate an LED in the user interface 290 so that maintenance crew members working the third shift are notified that the connector 150 is headed for an overheat condition (or in an overheat condition). This notification is based on analyzing the temperature and current profiles. The temperature and current profiles can be analyzed together as current carrying capacities of electrical conductors (e.g., wires and cables) decrease as their temperatures increase. In a similar manner, voltage profiles can be analyzed to determine that a potential voltage issue (e.g., a voltage surge or reduction that is outside of a threshold value) will arise at the connector 150. The application server 424 can provide additional intelligence that local instruments at the connector 150 would not have in real time, but that the application server 424 can identify based on analytical trending data. For example, the application server 424 would be able to gather this additional intelligence and then without requiring the connector to retrieve data from a data store or database, the application server 424 can instruct the user interface 290 to illuminate a discreet LED to alert maintenance personnel. In additional or alternative implementations, the alert can be more sophisticated than illuminating an LED. For instance, an indication can be displayed in a GUI (included in the user interface 290, in a GUI of the application server 424), communicated via email (e.g., SMTP), instant message, or a short message service (SMS) text message sent to ground crew members, mechanics, or maintenance personnel, or indicated in the GUI of a mobile device carried by or associated with such personnel. In this way, the system architecture 400 leverages additional knowledge gathered by the application server 424 and displays it in real time.

Figure 7:
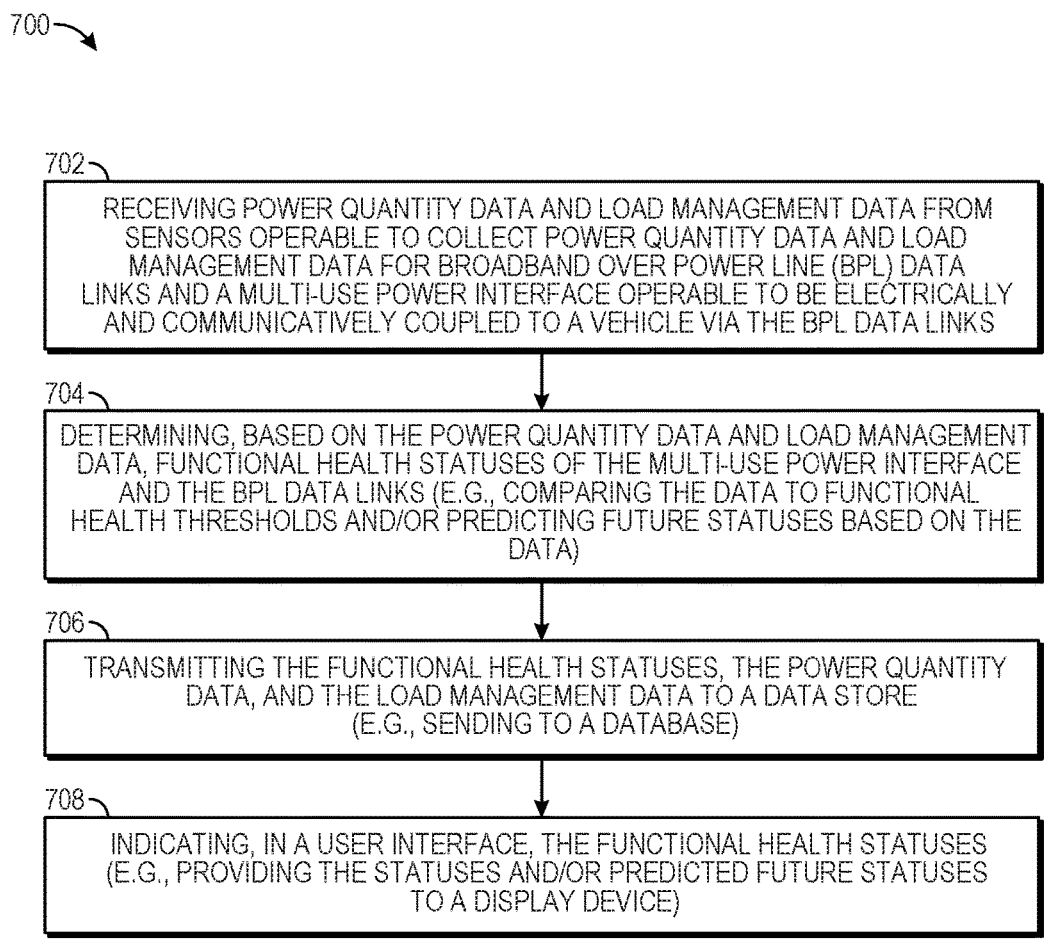
FIG. 7 illustrates a flowchart of a method for monitoring and analyzing BPL data collected at a connector of a multi-use power interface, according to one or more implementations of the disclosure.

FIG. 7 illustrates a flowchart of a method 700 for monitoring and analyzing data collected at a multi-use power interface in order to detect and predict health statuses of components of electrical and network systems, according to an implementation. The method 700 can use processing logic, which can include software, hardware, or a combination thereof. The monitoring can be via SNMP, TR-069, installed health agent or other. For example, the method 700 can be performed by a system including one or more components described above with reference to the system 400 of FIG. 4 (e.g., application server 424 and connector 150).

As shown, at 702, the method 700 includes measuring and/or receiving (at least a portion of) power quality data and load management data from sensors that are operable to collect power quality data and load management data for BPL data links and a multi-use power interface. As shown in FIG. 7, the multi-use power interface is operable to be electrically and communicatively coupled to a vehicle via the BPL data links. According to implementations, the multi-use power interface can be embodied as multi-use power interface 110 shown in FIGS. 1-6 and the vehicle can be embodied as the vehicle 120 shown in FIGS. 1 and 4-6.

At 704, the method 700 also includes determining, based on the power quality data and load management data, functional health statuses of the multi-use power interface and the BPL data links. As shown in FIG. 7, 704 can include comparing the data received at 702 to functional health thresholds. As shown, 704 can also include predicting future statuses based on the data (i.e., prognosticating potential future faults or malfunctions based on using analytics to identify patterns in stored, historical data).

At 706, the method 700 further includes transmitting the functional health statuses, the power quality data, and the load management data to a data store. As shown in the example of FIG. 7, 706 can include sending the functional health statuses, the power quality data, and the load management data to a database. In some implementations, the data store or database can be local to the connector 150 shown in FIGS. 1, 2 and 4-6 and the detachable adapter 350 shown in FIG. 3. In additional or alternative implementations, the data store or database can be hosted by a server (e.g., server 424) that is remote from the connector 150 and the detachable adapter 350 of FIG. 3. In some implementations, the data store is remote to the multi-use power interface 110, the connector 150 and the detachable adapter 350, and monitored data is transmitted along with the functional health statuses, the power quality data, and the load management data to the data store via a BPL modem over one or more BPL data links of the multi-use power interface 110 using BPL communications.

At 708, the method 700 additionally includes indicating, in a user interface, the functional health statuses. As shown in FIG. 7, 708 can include providing the functional health statuses and/or predicted future statuses to a display device. For example, 708 can include indicating or representing the functional health statuses on a display device used to present the user interface 290 at the connector 150 or at the detachable adapter 350 as shown in FIGS. 2 and 3. In alternative or additional implementations, 708 can include displaying the functional health statuses in a GUI from the application information within the application server 424. In alternative or additional implementations, 708 can include reporting faults to a network monitoring server. In certain implementations, 708 can also include indicating results of analytics performed on stored data. For example, 708 can include presenting results of big data analytics performed as a part of 704. Such results can include predictions based on patterns in stored, historical data and known past events (e.g., component failures and faults in electrical connections), as well as conditions that could lead to future failure and fault events (e.g., current or voltage fluctuations, overheating, moisture, physical trauma or shocks inflicted on the connector 150). That is, the results of analysis performed at 704 can be presented at 708 as health prognostications for components of the monitored electrical and network systems.

Figure 8:
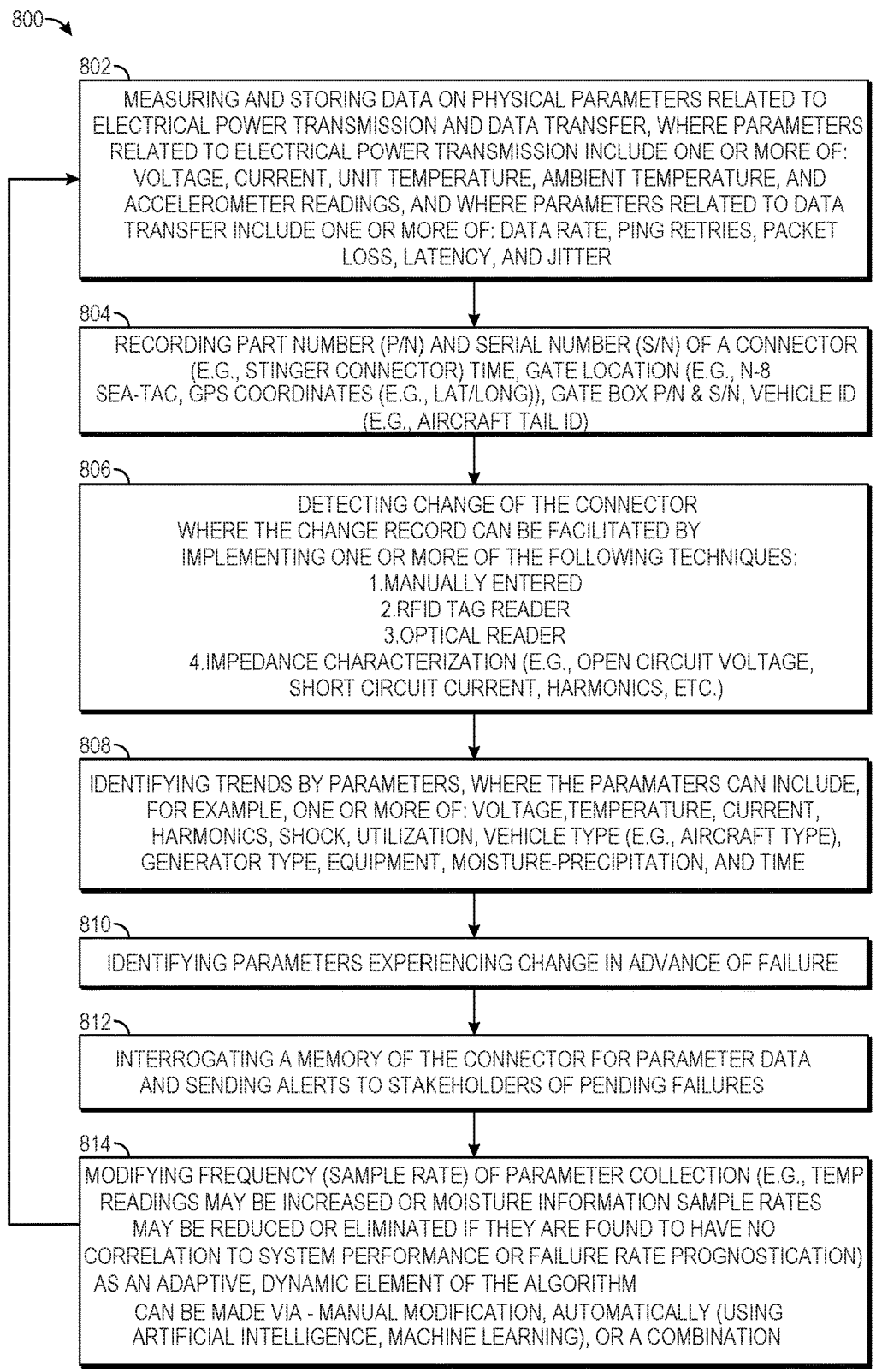
FIG. 8 illustrates a flowchart of a method for performing predictive analytics with collected sensor data and BPL data, according to one or more implementations of the disclosure.

FIG. 8 illustrates a flowchart of a method 800 for performing predictive analytics with collected sensor data and BPL data, according to one or more implementations of the disclosure. The method 800 can use processing logic, which can include software, hardware, or a combination thereof. For example, the method 800 can be performed by a system including one or more components described above with reference to the system 400 of FIG. 4 (e.g., server 424 and connector 150).

The method 800 uses predictive analytics and artificial intelligence to complete machine learning tasks such as regression, classification, collaborative filtering, ranking, and event prediction (e.g., equipment failure prediction). Some implementations of the method 800 leverage predictive analytics techniques to provide a prediction algorithm that runs in linear time and predicts equipment failure. Machine learning can be used to predict data that can exist in the real world (e.g., at an airport). Machine learning typically relies on providing positive true samples (e.g., past events such as equipment failures) and negative false samples, and teaching a machine (e.g., an application server 424 or other computing device) to distinguish between the positive and negative samples. Positive real-world data can be obtained by completing operations 802-806, which are described below. For example, in a machine learning algorithm that uses an individual component's history of faults and failures to predict a pending failure, positive samples can be obtained from the parameters measured and captured in operations 802 and 806.

As shown, at 802, the method 800 includes measuring and/or receiving, and storing (at least a portion of) data representing physical parameters related to electrical power transmission and data transfer. The parameters can be measured by sensors and can correspond to BPL data links and a multi-use power interface. The multi-use power interface can be configured to be electrically and communicatively coupled to a vehicle via the BPL data links. According to implementations, the multi-use power interface can be embodied as multi-use power interface 110 shown in FIGS. 1-6 and the vehicle can be embodied as the vehicle 120 shown in FIGS. 1 and 4-6. In some implementations, 802 includes storing the measured and/or received data representing physical parameters in a data store or database. In certain implementations, the data store or database can be local to the connector 150 shown in FIGS. 1, 2 and 4-6 and the detachable adapter 350 shown in FIG. 3. In additional or alternative implementations, the data store or database can be hosted by a server (e.g., application server 424) that is remote from the connector 150 and the detachable adapter 350 of FIG. 3. In some implementations, the data store is remote to the multi-use power interface 110, the connector 150 and the detachable adapter 350, and the measured and/or received parameters are transmitted to the data store via a BPL modem over one or more BPL data links of the multi-use power interface 110 using BPL communications.

As shown in the example of FIG. 8, the parameters related to electrical power transmission measured and stored at 802 can include one or more of voltage, current, unit temperature (e.g., internal temperature of an electrical or network component), ambient temperature (e.g., air temperature where an electrical or network component is located such as an airport jetway), and accelerometer readings. As further shown in FIG. 8, the parameters related to data transfer that are measured, received, and stored at 802 can include one or more of the following: data rate, ping retries, packet loss (e.g., a percentage of packets lost with respect to packets sent to a network component), latency, and jitter.

According to some implementations, the parameters related to electrical power transmission that are measured and stored at 802 form an electrical domain, and the parameters related to data transfer that are measured and stored at 802 form a data domain. In such embodiments, the electrical domain and the data transfer domain can be used as analytical cross-checks. For example, the two sets of data (i.e., in the electrical domain and data transfer domain) serve to amplify the use of big data analytics in the method 800, thus increasing the overall amount of statistically significant information, and enabling identification of a wider range of valuable correlations and predictive trending information.

At 804, the method 800 also includes recording identifiers of a connector for a multi-use power interface (e.g., stinger connector). According to implementations, the connector for the multi-use power interface can be embodied as the connector 150 for the multi-use power interface 110 shown in FIGS. 1, 2, and 4-6. In additional or alternative implementations, the connector can be embodied as the detachable adapter 350 and the standard connector 355 shown in FIG. 3. In the example of FIG. 8, the identifiers of the connector include a part number (P/N) and serial number (S/N) of the multi-use power interface. As shown in FIG. 8, 804 also includes recording a time (e.g., a timestamp), and a gate location. In the example of FIG. 8, the gate location can be recorded as gate identifier for an airport (e.g., gate N-8 at Sea-TAC airport) or as Global Positioning System (GPS) coordinates (e.g., latitude and longitude). As further shown in FIG. 8, 804 can include recording a gate box part number (P/N) and serial number (S/N), and a vehicle identifier. In the example of FIG. 8, the vehicle identifier can be an aircraft tail ID or a vehicle identification number (VIN).

At 806, the method 800 also includes detecting a change of a connector for a multi-use power interface (e.g., a stinger connector). As shown in FIG. 8, the change record can be facilitated several ways by implementing one or more of the following techniques: the change can be manually entered, the change can be recorded by an RFID tag reader (e.g., reading RFID tag on a connector 150), the change can be recorded by an optical reader (e.g., reading an optical bar code on the connector 150), or the change can be recorded as an impedance characterization. In the example of FIG. 8, such impedance characterizations can include one or more of an open circuit voltage, short circuit current, harmonics, and other characterizations of electrical impedance. In some implementations, such impedance characterizations trigger a data log capture of parameters leading up to the detected change (e.g., equipment change, equipment fault, or equipment failure detected at the connector). The captured parameters can include one or more of a gate box type, an ambient temperature, an outside temperature, an average current, and a utilization rate.

According to some implementations, 806 includes detecting a change in a memory of the connector 150, a change in a network characteristic or network component, a change in an airport gate box, a change in a GPS location or coordinate, or a location change detected by a global navigation satellite system (GNSS). In additional or alternative implementations, 806 includes detecting a change with sensors such as, for example, an accelerometer (e.g., an accelerometer integrated into the connector 150), a voltmeter, a current meter, a vector analyzer, and a spectrum analyzer. In accordance with certain implementations, 806 includes one or more of detecting a change in a data rate for a data communication link or data communication path, detecting a change in amplitude, detecting a frequency change, and detecting a phase change.

At 808, the method 800 further includes identifying trends by parameters. In the example of FIG. 8, the parameters can include measurements indicating one or more of a voltage, a temperature, a current, harmonics, shock, utilization (e.g., a percentage utilization for an electrical or network component), vehicle type (e.g., aircraft type), generator type, equipment (e.g., an equipment identifier for an electrical or network component), a measure of moisture, a measure of precipitation, and time (e.g., a timestamp). In some implementations, 808 can include comparing the parameters to historical data that includes previously measured and stored parameters that were obtained as a result of previous iterations performing operations 802-806. In additional or alternative implementations, the parameters used at 808 for identifying trends are not limited to those shown in FIG. 8. For instance, the parameters used at 808 can include historical data such as previously measured parameters obtained by prior iterations of operation 802.

At 810, the method 800 additionally includes identifying parameters experiencing change in advance of a failure of a network or electrical component. In some implementations, 810 can include using predictive analytics algorithms to examine historical parameter readings (e.g., historical data measured and captured in past iterations of 802 and 804) from a data store or database and identifying which parameters changed, and what the patterns of change were prior to a failure of a network or electrical component. For example, the parameters captured at 806 can be used at 810 to identify trending preconditions leading to equipment failure. In this way, the method 800 enables monitoring thresholds of pre-failure. In some implementations, the data store or database can be local to the connector 150 shown in FIGS. 1, 2 and 4-6 and the detachable adapter 350 shown in FIG. 3. In additional or alternative implementations, the data store or database can be hosted by a server (e.g., application server 424) that is remote from the connector 150 and the detachable adapter 350 of FIG. 3. In some implementations, the data store is remote to the connector 150 and the detachable adapter 350, and the measured parameters are transmitted to the data store via a BPL modem over one or more BPL data links of the multi-use power interface 110 using BPL communications.

At 812, the method 800 also includes interrogating the memory of the connector (e.g., a local memory of the connector 150) for parameter data and sending alerts to stakeholders of pending failures. In certain embodiments, the stakeholders can include, for example, airlines, airports, original equipment manufacturers (OEMs), and power generation companies (e.g., electric utilities).

By executing and repeating operations 802-812, a first feedback loop collects data and the method 800 looks for similar conditions to previous network and electrical equipment failures. By using the parameters from 802, 806, and 806 to identify similar conditions (e.g., parameters) that correlated to previous failures, 808-812 can be executed to predict or prognosticate pending failures.

At 814, the method 800 further includes modifying the frequency of parameter collection. In the example of FIG. 8, modifying frequencies of parameter collection can be performed by changing a sample rate for a parameter. For instance, as shown in FIG. 8, 814 can include increasing sampling rates for parameters such as temperature readings in response to determining that such parameters highly correlate to equipment failure. That is, if it is determined that there is a high correlation between temperature fluctuations (e.g., temperature spikes, extremes, or high temperatures) and equipment failure, 814 can include increasing a sample rate for temperature readings in order to improve failure rate prognostication. As also shown in FIG. 8, 814 can include decreasing or eliminating sample rates for other parameters, such as moisture information, responsive to determining that such parameter readings have little or no correlation to system performance or equipment failure rate prognostication.

As shown in FIG. 8, at 814, the frequency of parameter collection is modified as an adaptive, dynamic element of a predictive analytics algorithm. The respective frequencies for collection of parameters can be tunable values that can be manually modified. In additional or alternative implementations, the parameter collection frequencies can be automatically adjusted at 814 based on using artificial intelligence and completing machine learning tasks such as regression, classification, collaborative filtering, ranking, and event prediction (e.g., equipment failure prediction) and correlating parameters to events. In yet other additional or alternative implementations, the parameter collection frequencies can be adjusted at 814 in a hybrid manner. That is, the collection frequencies for parameters can be adjusted using a combination of manual modification and automatic modification.

After the parameter collection frequencies are adjusted at 814, control is passed back to 802 so that the parameters can be collected according to the adjusted parameter collection frequencies.

By repeating operations 802-814 a second feedback loop can modify the type of data collected and processed improving the predictive analytics algorithm. By using the method 800, a mean time between failure (MTBF) can be compiled for various network and electrical components, where the MTBF is the predicted elapsed time between inherent failures of a network or electrical component (e.g., in the system 400 of FIG. 4 during normal operation of the system 400. In certain implementations, the MTBF compiled by the method 800 is calculated as the arithmetic mean (average) time between failures of a network or electrical component of the system 400 of FIG. 4 or the system architecture 500 of FIG. 5. In accordance with certain implementations, the method 800 compiles MTBF values for repairable or replaceable network and electrical components. The method 800 can use its own data and add it to historical data, and in some cases, trending data can be exported to or imported into other systems in order to have more data for the analytics data to be improved. The method 800 also provides intelligence on ground power generation equipment (e.g., ground power system 130) and airplane load analysis. The method 800 looks for correlations between parameters and events for various electrical and network components of the system shown in FIG. 4 (e.g., airplane vehicle 120, multi-use power interface 110, and the ground power system 130).

Synthesized data resulting from the method 800 can be transmitted or routed to several stakeholders, such as, for example, airlines, airports, original equipment manufacturers (OEMs), and power generation companies (e.g., electric utilities).

As show in FIG. 8 and noted above, the operations of the method 800 described above can be iteratively executed. That is, operations 802-814 can be repeated so that the method 800 includes multiple phases for using sensor data and BPL data for predictive analytics to predict when electrical and network components may have events (e.g., experience faults or failures or otherwise require maintenance). These phases can include a first phase where initially, predictive analytics algorithms are used to look for trends. In particular, these algorithms identify trends with a focus on health of a multi-use power interface (e.g., stinger health). In a second phase, the algorithms can be improved to focus on the most valuable parameters (see, e.g., the parameters measured at 802, described above) at the optimal sample period. In a third phase, the algorithms look at trends in the health of a vehicle (e.g., airplane health). In a fourth phase, the algorithms look at trends in health of ground power generation equipment (e.g., health of a ground power system 130 or a ground power unit).

Figure 9:
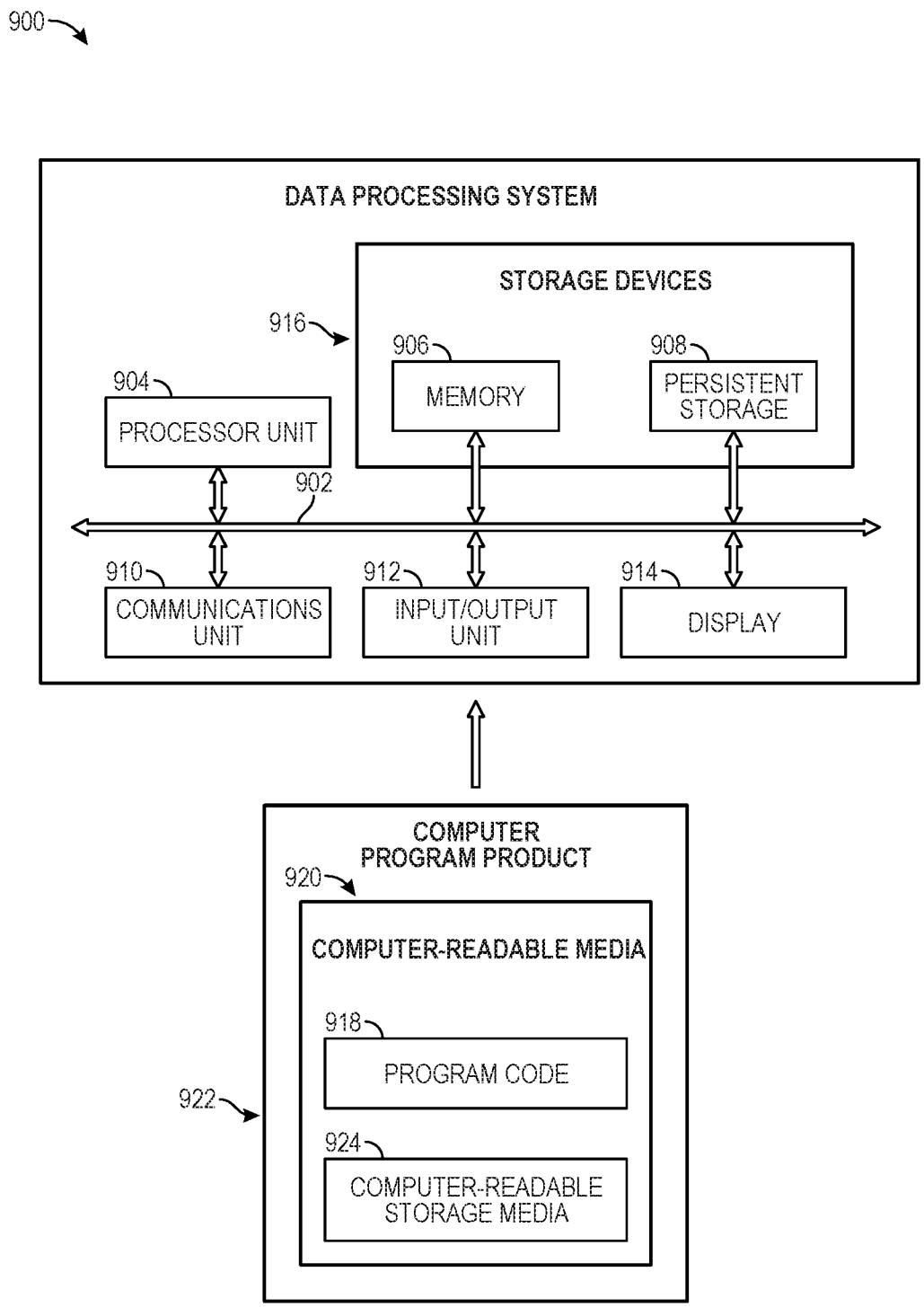
FIG. 9 is a block diagram illustrating an example of a computing system that can be used in conjunction with one or more implementations of the disclosure.

FIG. 9 is a block diagram illustrating an example of a computing system 900 that can be used in conjunction with one or more implementations of the disclosure. In certain implementations, the computing system 900 can be used to implement the application server 424 in FIGS. 4 and 5. According to some implementations, the computing system 900 can be used to implement the computing device 422 of the ground power system 130 shown in FIG. 4. In accordance with certain implementations, the computing system 900 can also be used to implement the on-board server 426 of the vehicle 120 shown in FIG. 4. In the example of FIG. 9, the computing system 900 includes a communications framework 902, which provides communications between processor unit 904, memory 906, persistent storage 908, communications unit 910, input/output (I/O) unit 912, and display device 914. In some implementations, the display device can be used to implement the user interface 290 in FIGS. 2 and 3. For example, an embedded touchscreen display device integrated into housing 250 of the connector shown in FIG. 2 can be used to present the user interface 290. Similarly, an embedded touchscreen display device integrated into of the detachable adapter 350 shown in FIG. 3 can be used to present the user interface 290. With continued reference to the example of FIG. 9, the communications framework 902 can take the form of a bus system.

The processor unit 904 serves to execute instructions for software that can be loaded into the memory 906. The processor unit 904 can be a number of processors, a multi-processor core, or some other type of processor, depending on the particular implementation.

The memory 906 and the persistent storage 908 are examples of storage devices 916. A storage device is any piece of hardware that is capable of storing information, such as, for example, without limitation, at least one of data, program code in functional form, or other suitable information either on a temporary basis, a permanent basis, or both on a temporary basis and a permanent basis. The storage devices 916 can also be referred to as computer-readable storage devices in these illustrative examples. The memory 906, in these examples, can be, for example, a random-access memory or any other suitable volatile or non-volatile storage device. The persistent storage 908 can take various forms, depending on the particular implementation.

For example, the persistent storage 908 can contain one or more components or devices. For instance, the persistent storage 908 can be a hard drive, a solid state hard drive, a flash memory, a rewritable optical disk, a rewritable magnetic tape, or some combination of the above. The media used by persistent storage 908 also can be removable. For example, a removable hard drive can be used to implement the persistent storage 908. The storage devices 916 can comprise non-transitory computer-readable media storing instructions, that when executed by the processor unit 904, cause the computing system 900 to perform operations.

The communications unit 910, in example implementations, provides for communications with other data processing systems or devices. In these illustrative examples, the communications unit 910 is embodied as a network interface card.

The input/output unit 912 allows for input and output of data with other devices that can be connected to computing system 900. For example, the input/output unit 912 can provide a connection for user input through at least one of a keyboard, a pointing device (e.g., a stylus), a mouse, a touchscreen display device (e.g., an embedded touchscreen display device used to implement the user interface 290 of FIGS. 2 and 3), a trackpad, a touch pad, or some other suitable input device. Further, input/output unit 912 can send output to a printer. Display device 914 provides a mechanism to display information to a user, such as, for example a user of the connector 150 of FIG. 2, a user of the detachable adapter 350 of FIG. 3, a user of the application server 424 of FIGS. 4 and 5, a user of the computing device 422 of FIG. 2, or a user of the on-board server 426 of FIG. 4.

Instructions for at least one of the operating system, applications, or programs can be located in the storage devices 916, which are in communication with the processor unit 904 through the communications framework 902. The processes and methods of the different implementations can be performed by the processor unit 904 using computer-implemented instructions, which can be located in a memory, such as the memory 906. For example, the operations of the methods 700 and 800 described above with reference to FIGS. 7 and 8 can be performed by the processor unit 904 using computer-implemented instructions.

These instructions are referred to as program code, computer usable program code, or computer-readable program code that can be read and executed by a processor in the processor unit 904. The program code in the different implementations can be embodied on different physical or computer-readable storage media, such as the memory 906 or persistent storage 908.

Program code 918 is located in a functional form on computer-readable media 920 that is selectively removable and can be loaded onto or transferred to the computing system 900 for execution by the processor unit 904. The program code 918 and computer-readable media 920 form computer program product 922 in these illustrative examples. In the example, computer-readable media 920 is computer-readable storage media 924. In these illustrative examples, computer-readable storage media 924 is a physical or tangible storage device used to store program code 918 rather than a medium that propagates or transmits program code 918.

Alternatively, the program code 918 can be transferred to the computing system 900 using a computer-readable signal media. The computer-readable signal media can be, for example, a propagated data signal containing the program code 918. For example, the computer-readable signal media can be at least one of an electromagnetic signal, an optical signal, or any other suitable type of signal. These signals can be transmitted over at least one of communications links, such as wireless communications links, optical fiber cable, coaxial cable, a wire, or any other suitable type of communications link such as, for example, BPL data links included in the multi-use power interface 110 of FIGS. 1-6.

The different components illustrated for the computing system 900 are not meant to provide architectural limitations to the manner in which different implementations can be implemented. The different illustrative implementations can be implemented in a data processing system including components in addition to or in place of those illustrated for the computing system 900. Other components shown in FIG. 9 can be varied from the illustrative examples shown. The different implementations can be implemented using any hardware device or system capable of running the program code 918.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. For example, operations and phases of the methods have been described as first, second, third, etc. As used herein, these terms refer only to relative order with respect to each other, e.g., first occurs before second. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

It will be appreciated that variants of the above-disclosed and other features and functions, or alternatives thereof, may be combined into many other different systems or applications. Various presently unforeseen or unanticipated alternatives, modifications, variations, or improvements therein can be subsequently made by those skilled in the art which are also intended to be encompasses by the following claims.

What is claimed is:

1. A system for collecting and monitoring data at a power interface, the system comprising:
    a multi-use power interface configured to be electrically and communicatively coupled to a vehicle via a plurality of Broadband over Power Line (BPL) data links; and
    a plurality of sensors configured to collect power quality data and load management data for the plurality of BPL data links and the multi-use power interface,
    wherein the multi-use power interface comprises a user interface, a processor, and a memory storing instructions thereon, that when executed by the processor, cause the multi-use power interface to perform operations including:
        receiving power quality data and load management data from the plurality of sensors;
        determining, based on the power quality data and load management data, functional health statuses of the multi-use power interface and the plurality of BPL data links;
        transmitting the functional health statuses, the power quality data, and the load management data to a data store; and
        indicating, in the user interface, the functional health statuses.

2. The system of claim 1, wherein the plurality of sensors include one or more of a domain reflectometer (TDR) and a frequency domain reflectometer (FDR) configured to collect power quality data by characterizing electrical conductors in the plurality of BPL data links.

3. The system of claim 1, wherein the multi-use power interface further comprises:
    a detachable adapter including the user interface, a wireless communications interface, a wired communications interface, and a plurality of pins for electrically and communicatively coupling the multi-use power interface to a connector of the vehicle via the plurality of BPL data links; and a ground power interface connection configured to be electrically and communicatively coupled to the vehicle via a ground power unit.

4. The system of claim 3, wherein the ground power interface connection is configured to provide alternating current (AC) power to a vehicle while engines of the vehicle are off.

5. The system of claim 1, wherein the power quality data includes at least one of a voltage, a current, a frequency, a power, a reactive power, a power factor, voltage harmonics, current harmonics, a total harmonic distortion, an amplitude voltage modulation, a frequency voltage modulation, a current demand amplitude, a current demand frequency modulation, a voltage ripple amplitude, a current ripple amplitude, a current ripple frequency, a voltage ripple frequency, a power interrupt, a magnetic field density (MFD), or another power quality parameter usable to determine a functional health status of a BPL data link of the plurality of BPL data links.

6. The system of claim 1, wherein the load management data includes at least one of a load identifier, current demand harmonics, a current demand amplitude, a current frequency modulation, a ripple current amplitude, a ripple current frequency, load impedance information, a load power factor, source impedance, impedance matching optimization, a magnetic field density (MFD), or another load management parameter usable to determine functional health statuses of one or more electrical components of the vehicle.

7. The system of claim 1, wherein determining the functional health status of a BPL data link of the plurality of BPL data links comprises determining whether the BPL data link is operating within an expected data rate range.

8. The system of claim 1, wherein the data store is local to the multi-use power interface, and wherein indicating the functional health statuses includes illuminating multicolor light emitting diodes (LEDs) in the user interface.

9. The system of claim 1, wherein the data store is remote to the multi-use power interface, and wherein the transmitting comprises transmitting the functional health statuses, the power quality data, and the load management data to the data store via a BPL modem over at least one of the plurality of BPL data links using BPL communications.

10. The system of claim 1, wherein the multi-use power interface further comprises:
a plurality of pins for electrically and communicatively coupling the multi-use power interface to the vehicle via the plurality of BPL data links;
electrical conductive materials for a three-phase alternating current (AC) power interface with the vehicle; and
one or more Gigabit fiber optic data links.

11. The system of claim 10, wherein the plurality of sensors include at least one optical time domain reflectometer (OTDR) configured to collect load management data by characterizing the one or more Gigabit fiber optic data links.

12. The system of claim 10, wherein determining the functional health status of the multi-use power interface comprises determining whether the one or more Gigabit fiber optic data links are operating within an expected data rate range.

13. A computer implemented method for collecting and monitoring data at a power interface, the method comprising:

receiving power quality data and load management data from a plurality of sensors operable to collect power quality data and load management data for a plurality of Broadband over Power Line (BPL) data links and a multi-use power interface operable to be electrically and communicatively coupled to a vehicle via the plurality of BPL data links;
determining, based on the power quality data and load management data, functional health statuses of the multi-use power interface and the plurality of BPL data links;
transmitting the functional health statuses, the power quality data, and the load management data to a data store; and
indicating, in a user interface, the functional health statuses.

14. The method of claim 13, wherein the power quality data includes at least one of a voltage, a current, a frequency, a power, a reactive power, a power factor, voltage harmonics, current harmonics, a total harmonic distortion, an amplitude voltage modulation, a frequency voltage modulation, a current demand amplitude, a current demand frequency modulation, a voltage ripple amplitude, a current ripple amplitude, a current ripple frequency, a voltage ripple frequency, a power interrupt, a magnetic field density (MFD), or another power quality parameter usable to determine a functional health status of a BPL data link of the plurality of BPL data links.

15. The method of claim 13, wherein the load management data includes at least one of a load identifier, current demand harmonics, a current demand amplitude, a current frequency modulation, a ripple current amplitude, a ripple current frequency, a load impedance information, a load power factor, source impedance, impedance matching optimization, or another load management parameter usable to determine functional health statuses of one or more electrical components of the vehicle.

16. The method of claim 13, wherein determining the functional health status of a BPL data link of the plurality of BPL data links comprises determining whether the BPL data link is operating within an expected data rate range.

17. The method of claim 13, wherein the data store is local to the multi-use power interface, and wherein indicating the functional health statuses includes illuminating multicolor light emitting diodes (LEDs) in the user interface.

18. The method of claim 13, wherein the data store is remote to the multi-use power interface, and wherein the transmitting comprises transmitting the functional health statuses, the power quality data, and the load management data to the data store via a BPL modem over at least one of the plurality of BPL data links using BPL communications.

19. The method of claim 13, wherein the plurality of sensors include one or more of a time domain reflectometer (TDR) and a frequency domain reflectometer (FDR) configured to collect power quality data by characterizing electrical conductors in the plurality of BPL data links.

20. A system for collecting and monitoring data from a power interface, the system comprising:
a plurality of sensors configured to collect power quality data and load management data for a plurality of Broadband over Power Line (BPL) data links and for a multi-use power interface configured to be electrically and communicatively coupled to a vehicle via the plurality of BPL data links; and a server comprising a display device, a processor, and a memory storing instructions thereon, that when executed by the processor, cause the server to perform operations including:
- receiving, via a communications link, power quality data and load management data from the plurality of sensors;
- determining, based on the power quality data and load management data, functional health statuses of the multi-use power interface and the plurality of BPL data links;
- storing, in the memory, the functional health statuses, the power quality data, and the load management data; and
- presenting, in a user interface on the display device, the functional health statuses.

21. The system of claim 20, wherein the plurality of sensors include one or more of a domain reflectometer (TDR) and a frequency domain reflectometer (FDR) configured to collect power quality data by characterizing electrical conductors in the plurality of BPL data links.

\* \* \* \* \*